US011289578B2

(12) United States Patent
Lee et al.

(10) Patent No.: US 11,289,578 B2
(45) Date of Patent: Mar. 29, 2022

(54) SELECTIVE ETCHING TO INCREASE THRESHOLD VOLTAGE SPREAD

(71) Applicant: Taiwan Semiconductor Manufacturing Company, Ltd., Hsinchu (TW)

(72) Inventors: Hsin-Yi Lee, Hsinchu (TW); Ya-Huei Li, Tainan (TW); Da-Yuan Lee, Jhubei (TW); Ching-Hwanq Su, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/398,922

(22) Filed: Apr. 30, 2019

(65) Prior Publication Data
US 2020/0350414 A1 Nov. 5, 2020

(51) Int. Cl.
*H01L 29/40* (2006.01)
*H01L 27/088* (2006.01)
*H01L 21/3215* (2006.01)
*H01L 21/8234* (2006.01)
*H01L 21/285* (2006.01)
*H01L 29/49* (2006.01)

(52) U.S. Cl.
CPC ...... *H01L 29/401* (2013.01); *H01L 21/28568* (2013.01); *H01L 21/3215* (2013.01); *H01L 21/823437* (2013.01); *H01L 27/0886* (2013.01); *H01L 29/4966* (2013.01)

(58) Field of Classification Search
CPC combination set(s) only.
See application file for complete search history.

(56) References Cited

U.S. PATENT DOCUMENTS

| 9,362,385 | B2 | 6/2016 | Cheng et al. | |
|---|---|---|---|---|
| 9,780,183 | B2* | 10/2017 | Kim | ...... H01L 29/4966 |
| 9,871,114 | B2* | 1/2018 | Wu | ...... H01L 21/28026 |
| 9,947,540 | B2 | 4/2018 | Tsai et al. | |
| 9,972,694 | B2 | 5/2018 | Lee et al. | |
| 9,978,601 | B2 | 5/2018 | Tsai et al. | |
| 10,049,940 | B1* | 8/2018 | Chen | ...... H01L 29/495 |
| 10,096,599 | B2 | 10/2018 | Tsai et al. | |
| 10,177,043 | B1* | 1/2019 | Tsao | ...... H01L 21/82345 |
| 10,283,619 | B2* | 5/2019 | Wu | ...... H01L 29/66636 |
| 10,312,340 | B2* | 6/2019 | Kim | ...... H01L 27/0886 |
| 10,497,626 | B2 | 12/2019 | Chen et al. | |
| 10,504,789 | B1* | 12/2019 | Tsai | ...... H01L 21/823462 |

(Continued)

FOREIGN PATENT DOCUMENTS

CN    106328594 A    1/2017
KR    20150071637 A    6/2015
(Continued)

*Primary Examiner* — Telly D Green
(74) *Attorney, Agent, or Firm* — Slater Matsil, LLP

(57) ABSTRACT

A method includes forming a gate dielectric comprising a portion extending on a semiconductor region, forming a barrier layer comprising a portion extending over the portion of the gate dielectric, forming a work function tuning layer comprising a portion over the portion of the barrier layer, doping a doping element into the work function tuning layer, removing the portion of the work function tuning layer, thinning the portion of the barrier layer, and forming a work function layer over the portion of the barrier layer.

20 Claims, 26 Drawing Sheets

(56) References Cited

U.S. PATENT DOCUMENTS

| | | | |
|---|---|---|---|
| 10,510,621 B2 * | 12/2019 | Chen | H01L 29/66795 |
| 10,714,581 B2 | 7/2020 | Chang et al. | |
| 2006/0097347 A1 * | 5/2006 | Feller | C09K 3/1463 |
| | | | 257/532 |
| 2012/0285518 A1 * | 11/2012 | De Souza | H01L 31/022441 |
| | | | 136/255 |
| 2014/0106531 A1 * | 4/2014 | Cabral, Jr | H01L 29/78 |
| | | | 438/299 |
| 2014/0112824 A1 * | 4/2014 | Thompson | C23C 16/45531 |
| | | | 420/580 |
| 2015/0206963 A1 | 7/2015 | Ho et al. | |
| 2015/0357244 A1 * | 12/2015 | Ragnarsson | H01L 21/28088 |
| | | | 438/275 |
| 2016/0049301 A1 * | 2/2016 | Huang | H01L 21/28088 |
| | | | 438/592 |
| 2016/0181163 A1 * | 6/2016 | Huang | H01L 21/823857 |
| | | | 257/369 |
| 2016/0203988 A1 * | 7/2016 | Zhao | H01L 29/513 |
| | | | 257/392 |
| 2016/0225868 A1 * | 8/2016 | Kim | H01L 21/823462 |
| 2017/0032972 A1 * | 2/2017 | Tsai | H01L 21/28088 |
| 2017/0092740 A1 * | 3/2017 | Wu | H01L 21/28088 |
| 2017/0162570 A1 * | 6/2017 | Shih | H01L 29/66545 |
| 2017/0221889 A1 | 8/2017 | Dasgupta et al. | |
| 2017/0352559 A1 | 12/2017 | Liu et al. | |
| 2018/0019314 A1 * | 1/2018 | Kim | H01L 21/823462 |
| 2018/0138178 A1 | 5/2018 | Lin et al. | |
| 2018/0145151 A1 * | 5/2018 | Wu | H01L 29/66545 |
| 2018/0218912 A1 | 8/2018 | Tsai et al. | |
| 2019/0067279 A1 | 2/2019 | Tsau et al. | |
| 2019/0096678 A1 | 3/2019 | Tsai et al. | |
| 2019/0318967 A1 * | 10/2019 | Chen | H01L 29/66795 |
| 2019/0371674 A1 * | 12/2019 | Wu | H01L 21/823456 |
| 2019/0371675 A1 * | 12/2019 | Tsai | H01L 21/82345 |
| 2020/0083108 A1 * | 3/2020 | Tsai | H01L 21/823431 |

FOREIGN PATENT DOCUMENTS

| | | |
|---|---|---|
| TW | 201626445 A | 7/2016 |
| TW | 201841343 A | 11/2018 |
| TW | 201913755 A | 4/2019 |

\* cited by examiner

SELECTIVE ETCHING TO INCREASE THRESHOLD VOLTAGE SPREAD

BACKGROUND

Metal-Oxide-Semiconductor (MOS) devices typically include metal gates, which are formed to solve poly-depletion effect in conventional polysilicon gates. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

A metal gate may include a plurality of layers to meet the requirements of NMOS devices and PMOS devices. The formation of metal gates typically involves depositing a plurality of metal layers, forming a filling metal region with tungsten, and then performing a Chemical Mechanical Polish (CMP) process to remove excess portions of the metal layers. The remaining portions of the metal layers form metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
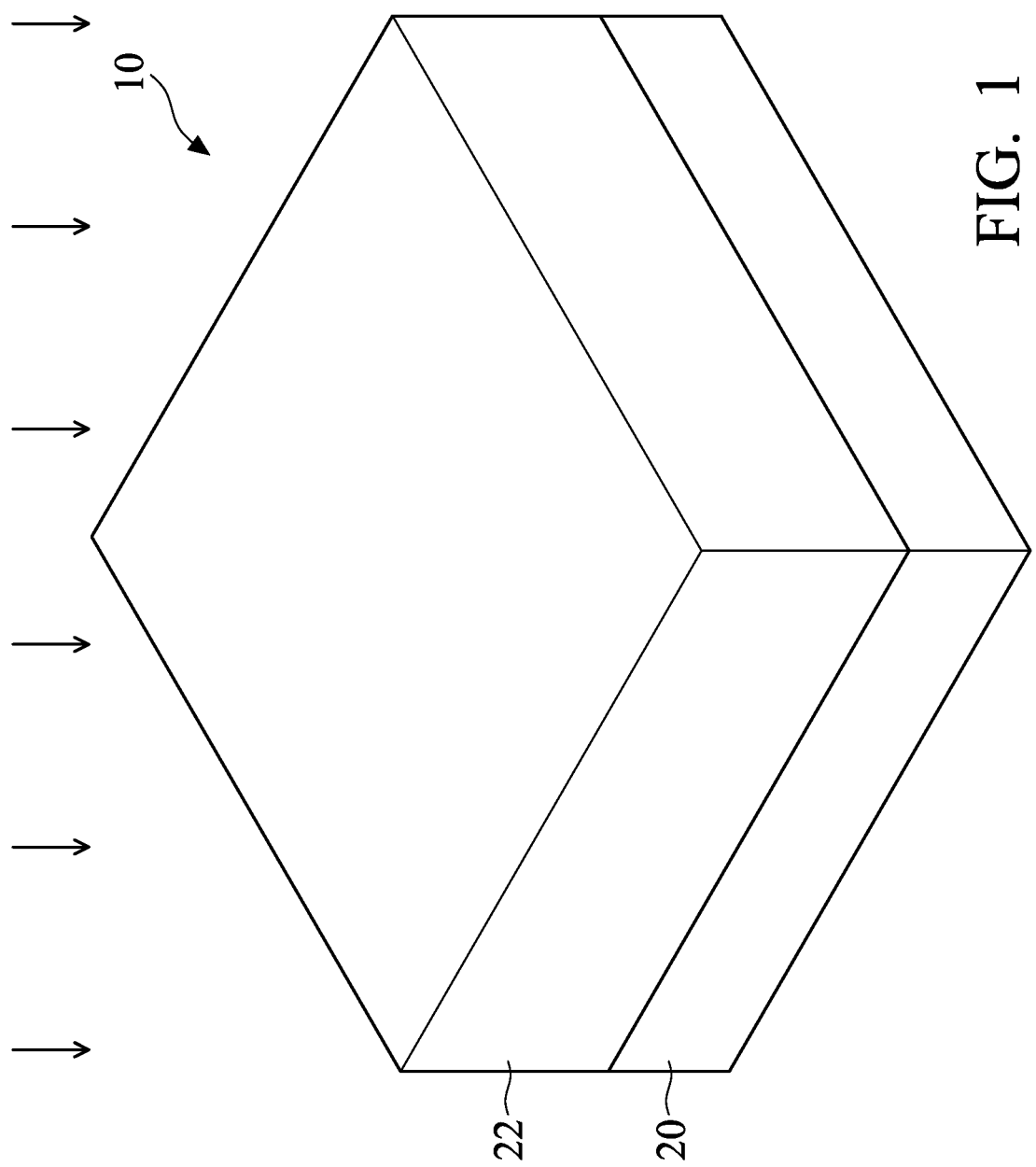
FIGS. 1-6, 7A, 7B, 8A, 8B, 9-21, 22A, and 22B illustrate the perspective views and cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors with replacement gates and the methods of forming the same are provided in accordance with some embodiments. The intermediate stages of forming the transistors are illustrated in accordance with some embodiments. Some variations of some embodiments are discussed. Throughout the various views and illustrative embodiments, like reference numbers are used to designate like elements. In the illustrated embodiments, the formation of Fin Field-Effect Transistors (FinFETs) is used as an example to explain the concept of the present disclosure. Planar transistors and Gate-All-Around (GAA) transistors may also adopt the concept of the present disclosure. In accordance with some embodiments of the present disclosure, aluminum is doped into a (titanium nitride) work function tuning layer to increase the etching selectivity between a (tantalum nitride) barrier layer and the titanium nitride work function tuning layer, so that when the barrier layer is thinned, the loss in the thickness of work function tuning layer is reduced, and the spread between the threshold voltages of the transistors may be kept from being reduced.

FIGS. 1-6, 7A, 7B, 8A, 8B, 9-21, 22A, and 22B illustrate the cross-sectional views and perspective views of intermediate stages in the formation of Fin Field-Effect Transistors (FinFETs) in accordance with some embodiments of the present disclosure. The processes shown in these figures are also reflected schematically in the process flow 400 shown in FIG. 23.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In accordance with some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 402 in the process flow 400 shown in FIG. 23. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
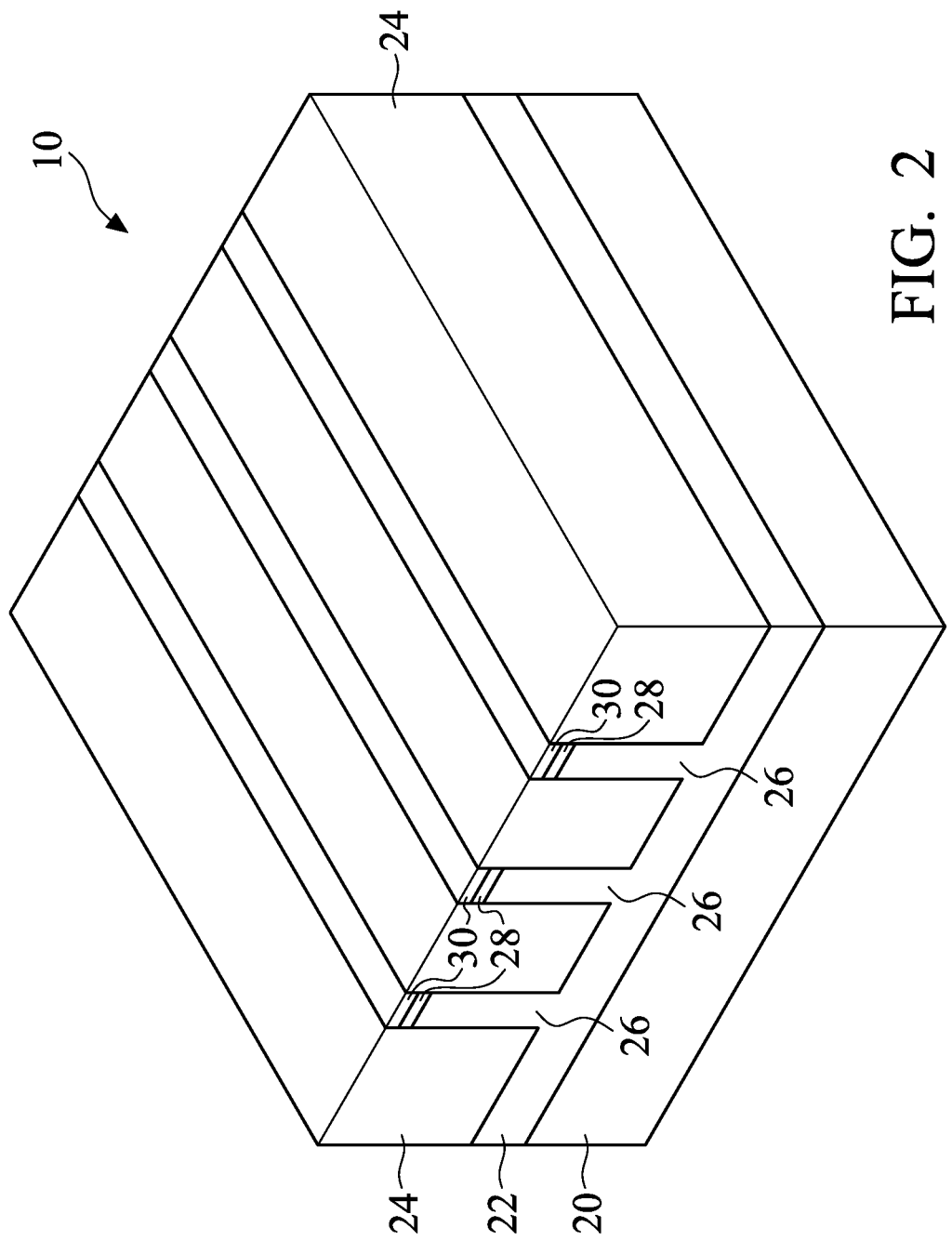

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 404 in the process flow 400 shown in FIG. 23. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
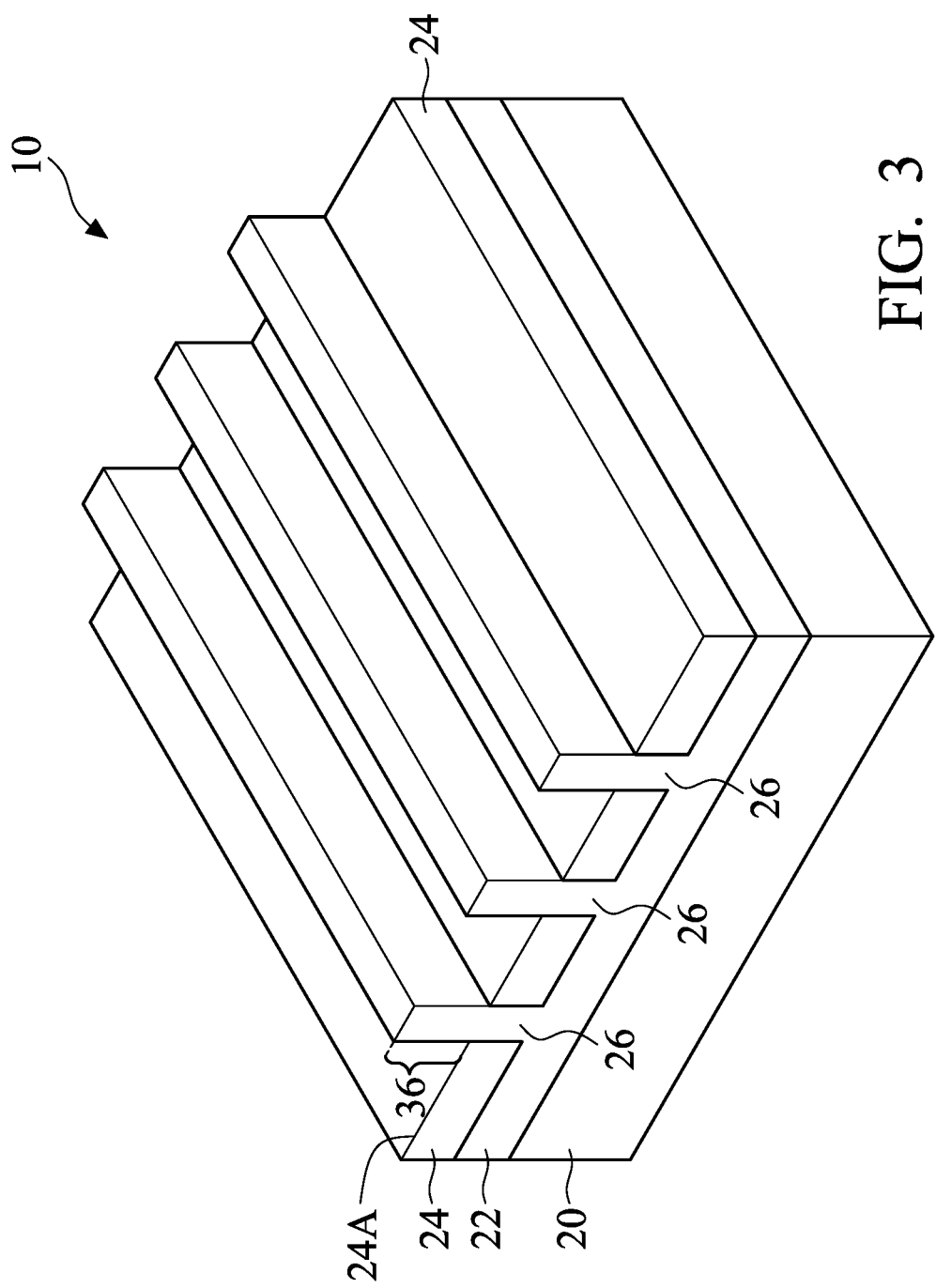

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 406 in the process flow 400 shown in FIG. 23. The etching may be performed using a dry etching process, wherein $HF_3$ and $NH_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
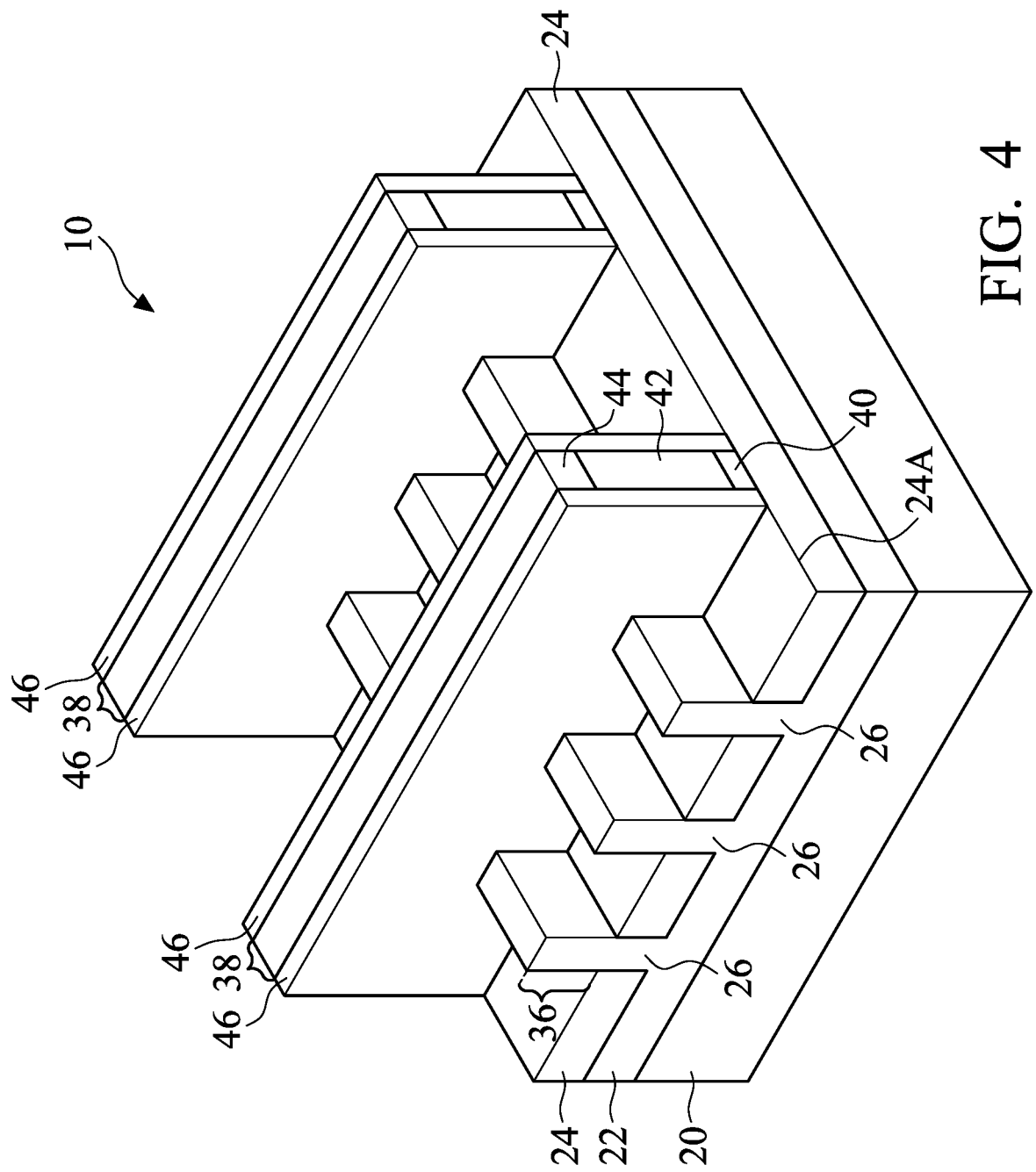

Referring to FIG. 4, dummy gate stacks 38 are formed to extend on the top surfaces and the sidewalls of (protruding) fins 36. The respective process is illustrated as process 408 in the process flow 400 shown in FIG. 23. Dummy gate stacks 38 may include dummy gate dielectrics 40 and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 408 in the process flow 400 shown in FIG. 23. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
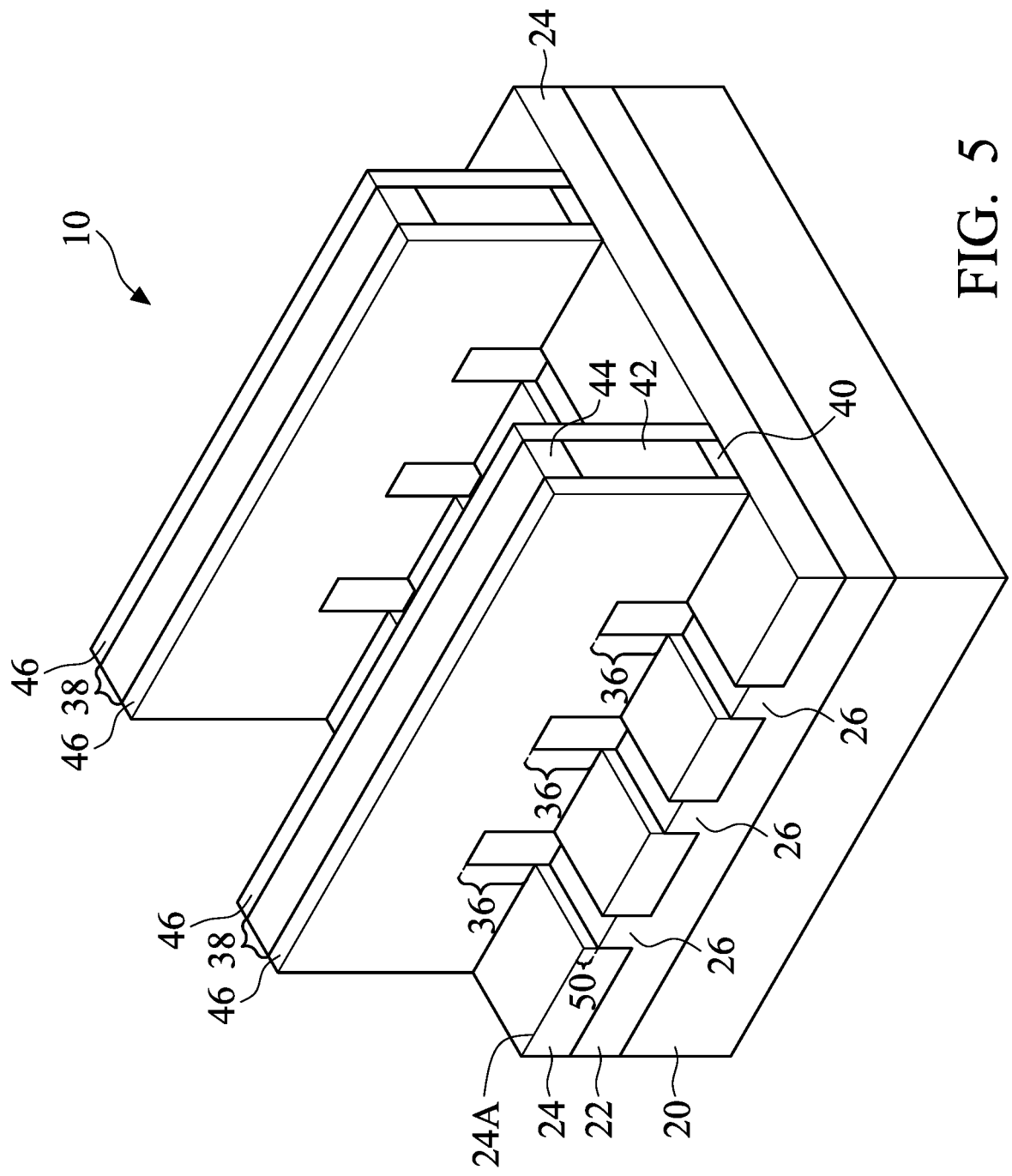

An etching process is then performed to etch the portions of protruding fins 36 that are not covered by dummy gate stacks 38 and gate spacers 46, resulting in the structure shown in FIG. 5. The respective process is illustrated as process 410 in the process flow 400 shown in FIG. 23. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. The space left by the etched portions of protruding fins 36 are referred to as recesses 50. Recesses 50 comprise portions located on the opposite sides of dummy gate stacks 38, and portions between remaining portions of protruding fins 36.

Figure 6:
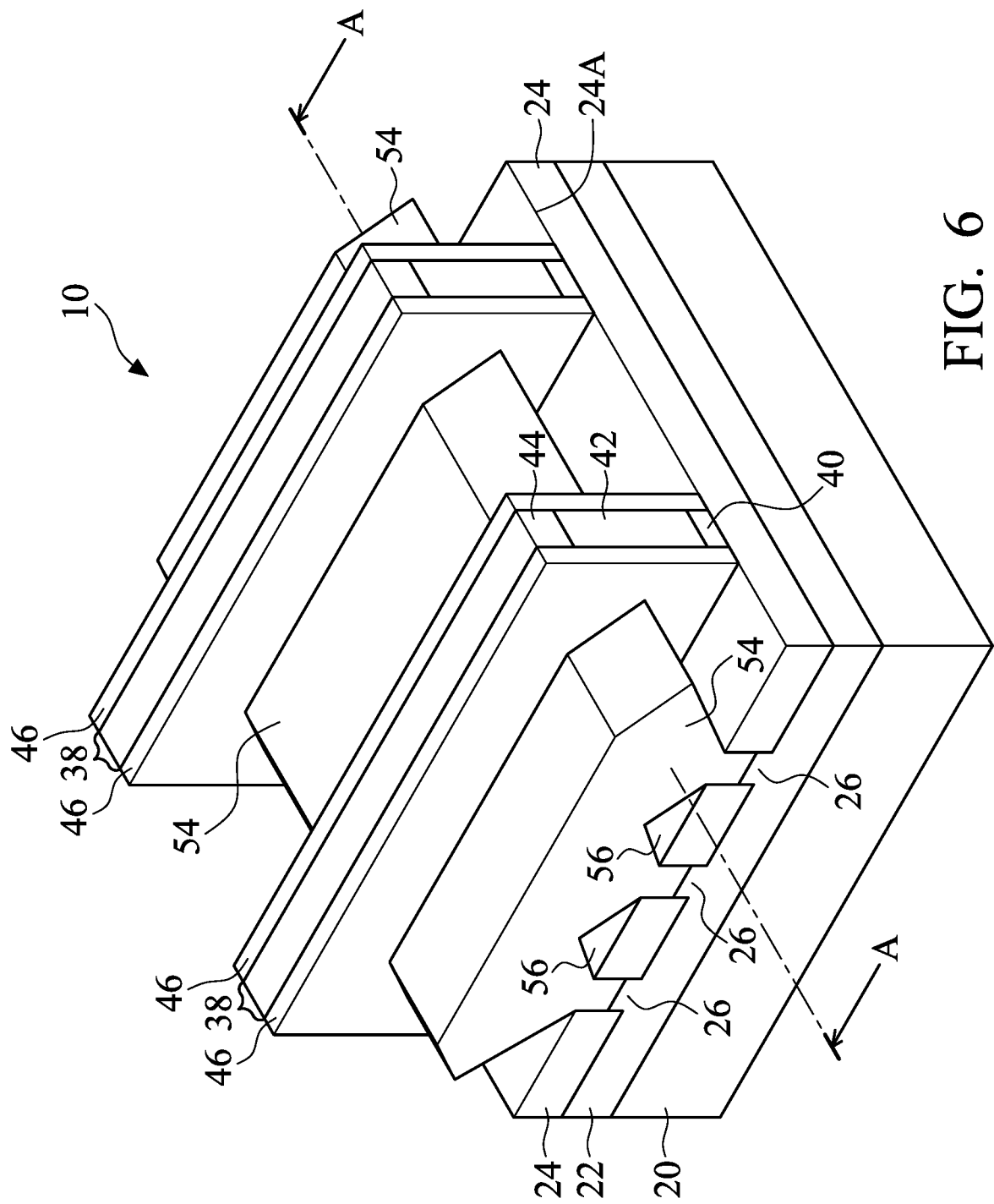

Next, epitaxy regions (source/drain regions) 54 are formed by selectively growing (through epitaxy) a semiconductor material in recesses 50, resulting in the structure in FIG. 6. The respective process is illustrated as process 412 in the process flow 400 shown in FIG. 23. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated. In accordance with some embodiments of the present disclosure, the formation of epitaxy regions 54 may be finished when the top surface of epitaxy regions 54 is still wavy, or when the top surface of the merged epitaxy regions 54 has become planar, which is achieved by further growing on the epitaxy regions 54 as shown in FIG. 6.

After the epitaxy step, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 7A:
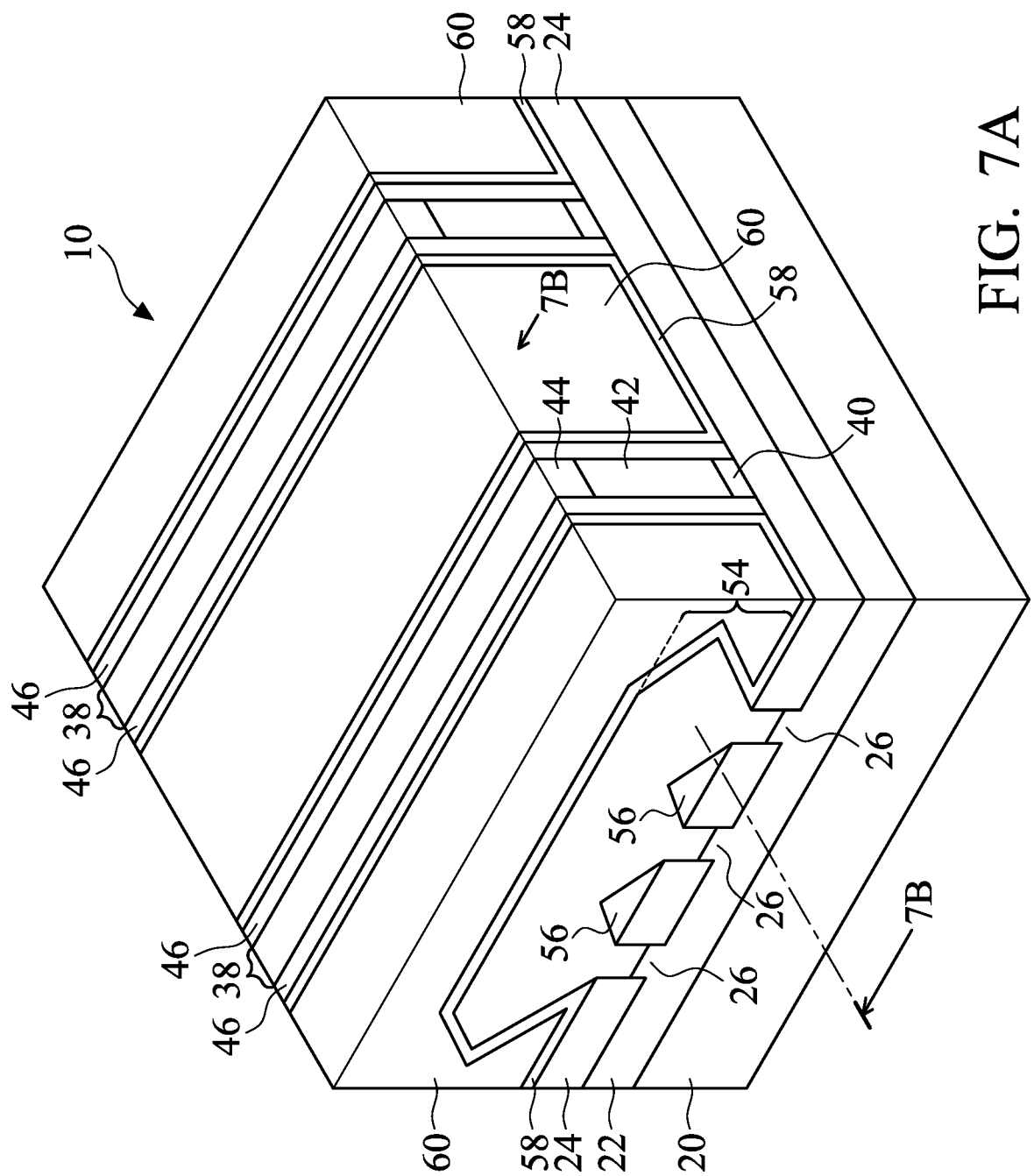

FIG. 7A illustrates a perspective view of the structure after the formation of Contact Etch Stop Layer (CESL) 58 and Inter-Layer Dielectric (ILD) 60. The respective process is illustrated as process 414 in the process flow 400 shown in FIG. 23. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
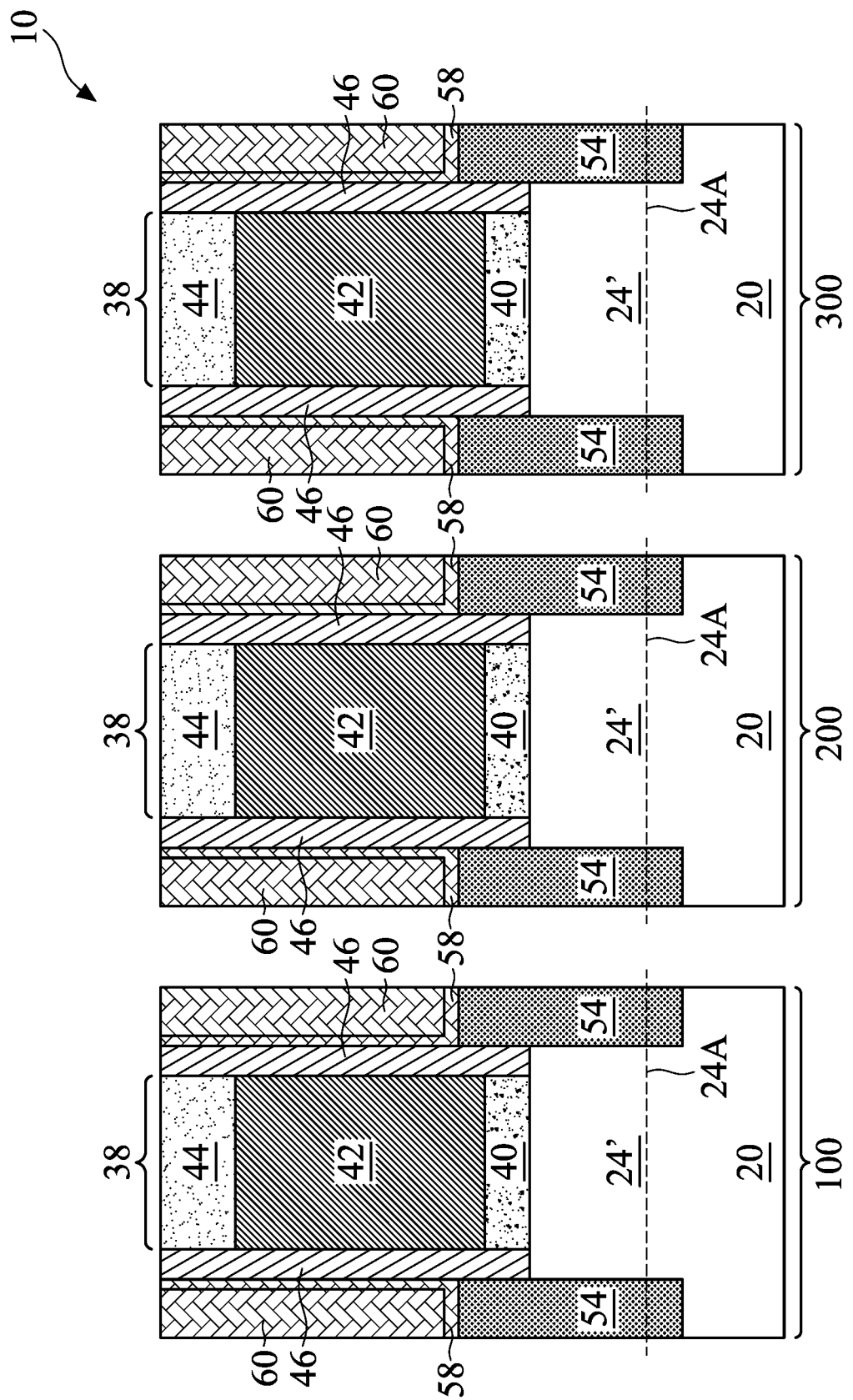

FIG. 7B illustrates the cross-sectional views of an intermediate structure in the formation of a first, a second, and a third FinFET on the same substrate 20. The first, the second, and the third FinFETs are formed in device regions 100, 200, and 300, respectively. In accordance with some embodiments, the first, the second, and the third FinFETs are of a same conductivity type, and may be all p-type FinFETs or all n-type FinFETs. The first, the second, and the third FinFETs are intended to be formed with different threshold voltages with adequate differences (spread). For example, when the FinFETs are n-type FinFETs, the FinFET (190 in FIG. 22A) in device region 100 has the lowest threshold voltage among FinFETs 190, 290, and 390, and the FinFET (390 in FIG. 22A) in device region 300 has the highest threshold voltage. Conversely, when the FinFETs are p-type FinFETs, the FinFET in device region 100 has the highest threshold voltage among FinFETs 190, 290, and 390, and the FinFET in device region 300 has the lowest threshold voltage. In accordance with alternative embodiments, the first, the second, and the third FinFETs are of different conductivity types, and each of the first, the second, and the third FinFETs may be a p-type FinFET or an n-type FinFET in any combination. The initial formation processes of each of the first, the second, and the third FinFETs may include the processes as shown in FIGS. 1 through 7A, and thus may have a structure similar to the structure shown in FIG. 7A. The structure in each of the first device region 100, the second device region 200, and the third device region 300 as shown in FIG. 7B may be obtained from the reference cross-section 7B-7B as shown in FIG. 7A.

After the structure shown in FIGS. 7A and 7B is formed, the dummy gate stacks 38 in device regions 100, 200, and 300 are replaced with metal gates and replacement gate dielectrics, as shown in FIGS. 8A, 8B and 9 through 20. In FIGS. 8A, 8B and 9 through 20, the top surfaces 24A of STI regions 24 are illustrated, and semiconductor fins 24' protrude higher than the respective top surfaces 24A.

Figure 8A:
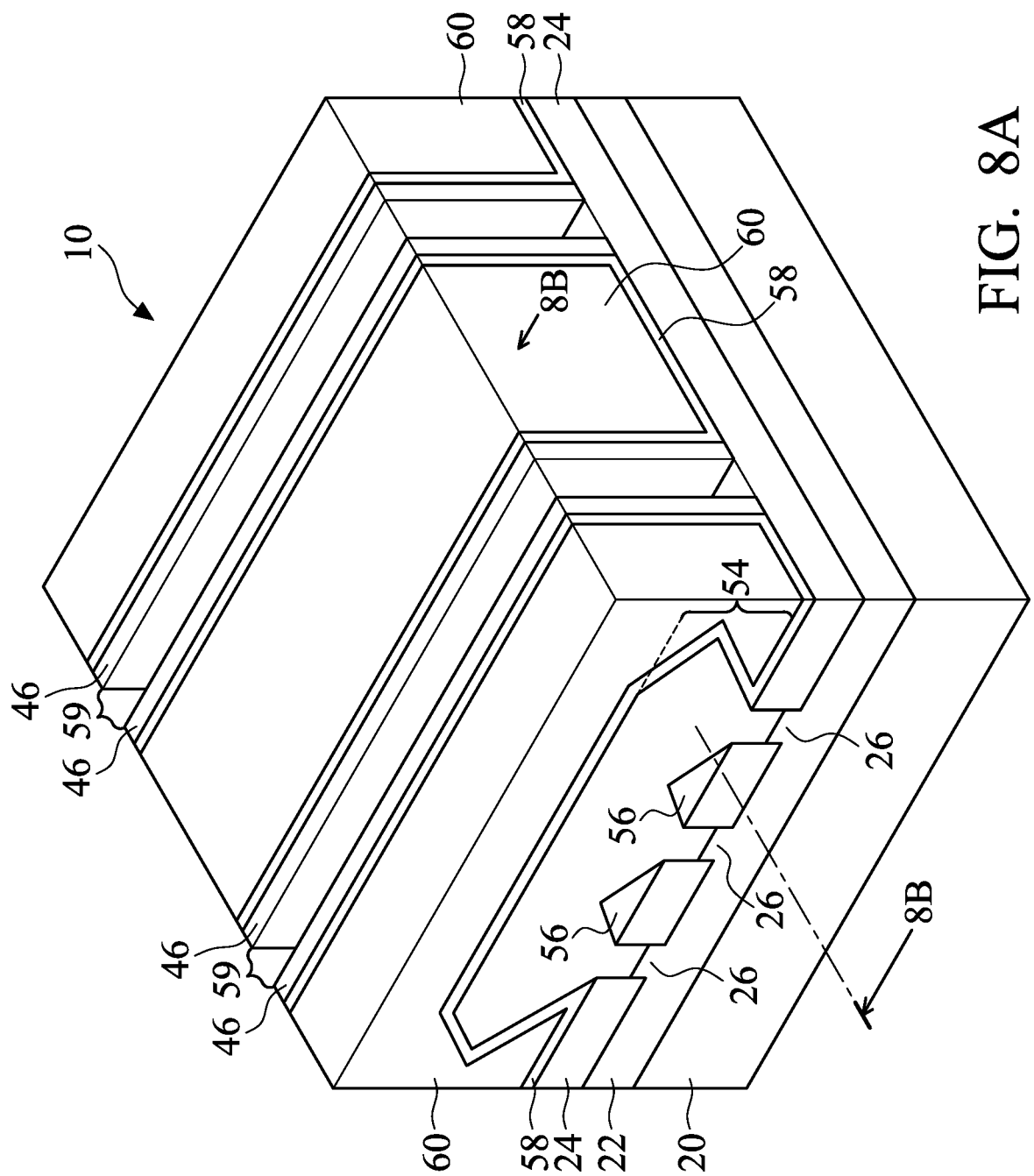
Figure 8B:
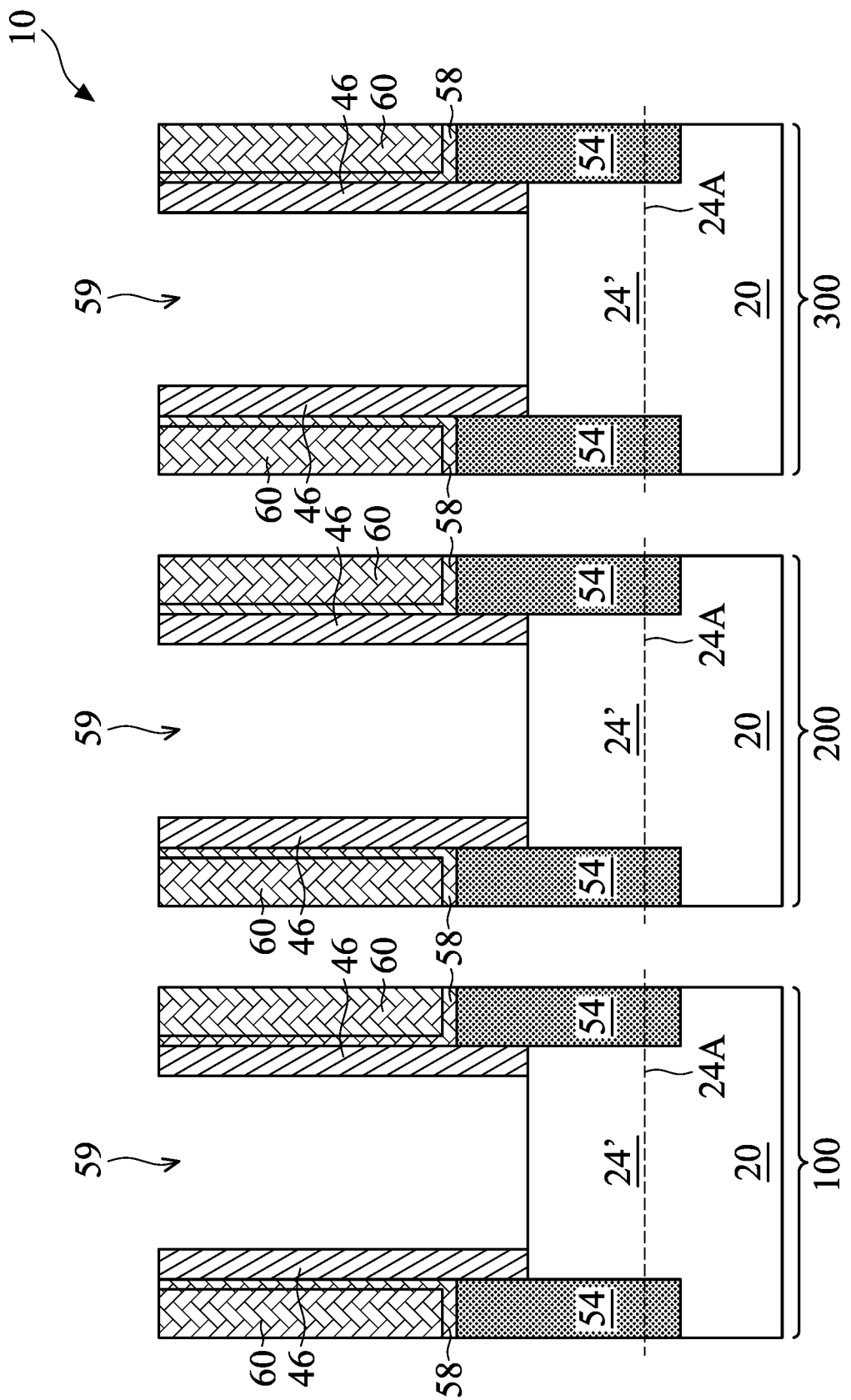

To form the replacement gates, hard mask layers 44, dummy gate electrodes 42, and dummy gate dielectrics 40 as shown in FIGS. 7A and 7B are removed first, forming openings 59 as shown in FIGS. 8A and 8B. The respective process is illustrated as process 416 in the process flow 400 shown in FIG. 23. The top surfaces and the sidewalls of protruding fins 24' are exposed to openings 59.

Figure 9:
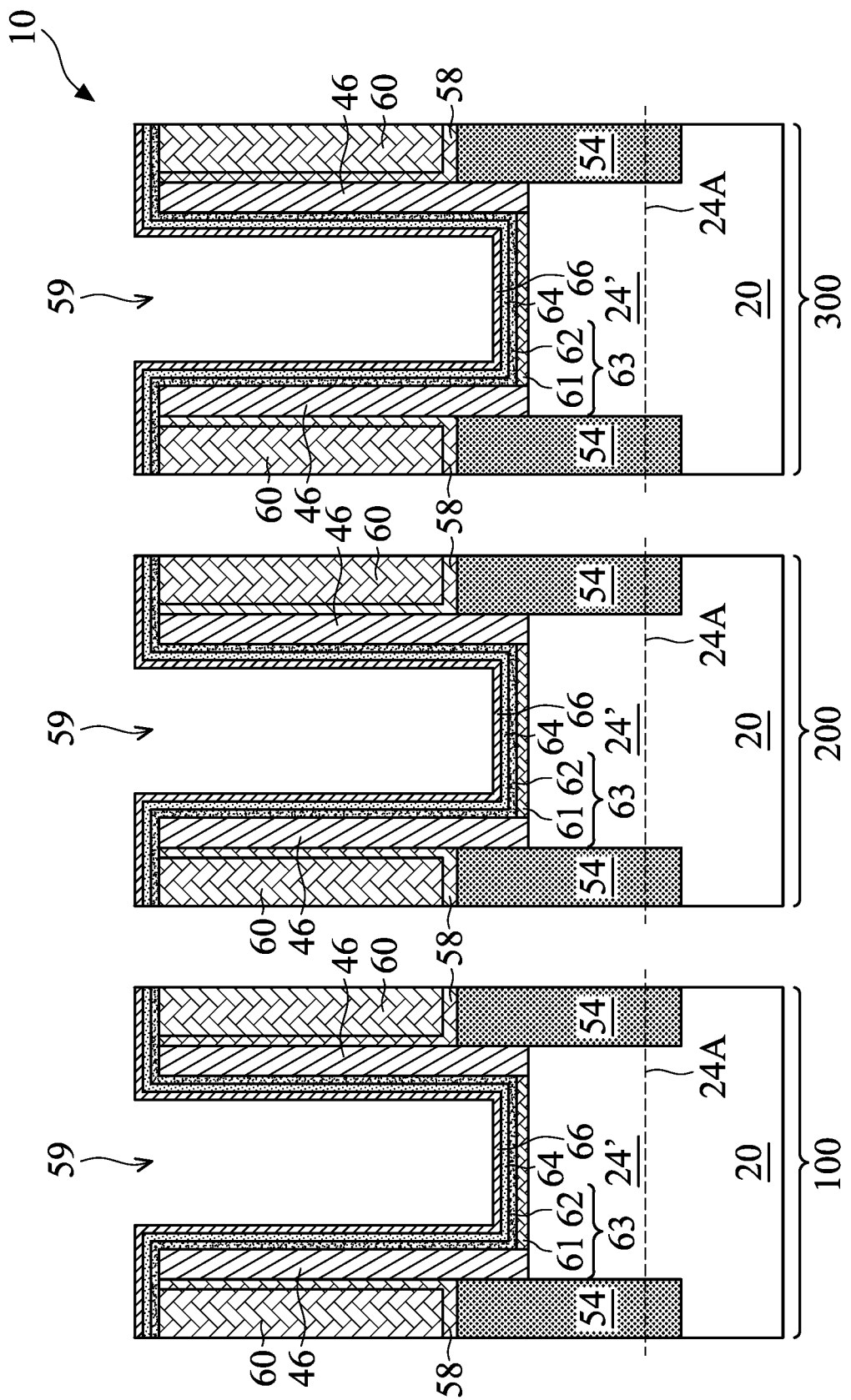

Next, referring to FIG. 9, gate dielectrics 63 are formed, which extend into openings 59, respectively. The respective process is illustrated as process 418 in the process flow 400 shown in FIG. 23. In accordance with some embodiments of the present disclosure, gate dielectrics 63 include Interfacial Layers (ILs) 61, which are formed on the exposed surfaces of protruding fins 24'. Each of ILs 61 may include an oxide layer such as a silicon oxide layer, which is formed through the thermal oxidation of protruding fins 24', a chemical oxidation process, or a deposition process. Gate dielectrics 63 may also include high-k dielectric layers 62 over the corresponding ILs 61. High-k dielectric layers 62 may be formed of a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. High-k dielectric layers 62 are overlying, and may contact, the respective underlying ILs 61. High-k dielectric layers 62 are formed as conformal layers, and extend on the sidewalls of protruding fins 24' and the top surface and the sidewalls of gate spacers 46. In accordance with some embodiments of the present disclosure, high-k dielectric layers 62 are formed using ALD or CVD. High-k dielectric layers 62 in device regions 100, 200, and 300 may be portions of the same dielectric layer, and are formed simultaneously with the same material and having the same thickness, or formed separately with different materials and/or having different thicknesses.

Capping layers 64 and barrier layers 66 are then formed conformally on the gate dielectrics 63. The respective process is illustrated as process 420 in the process flow 400 shown in FIG. 23. Capping layers 64 and barrier layers 66 may also be referred to as first sub-capping-layers and second sub-capping-layers, respectively. In accordance with some embodiments, each of capping layer 64 and barrier layer 66 may be a single layer or may comprise additional sub-layers. Barrier layers 66 may function to prevent a subsequently deposited metal-containing material from diffusing into gate dielectrics 63. Furthermore, barrier layers 66, as illustrated, can function as an etch stop layer during the subsequent etching of work function tuning layers in device regions 100 and 200 if capping layers 64 are formed from a same material as the subsequently formed work function tuning layers, as will become clearer subsequently. Capping layers 64 may be formed of or comprise titanium nitride (TiN) or the like deposited conformally on the gate dielectrics 63 by ALD, CVD, or the like. Barrier layers 66 may be formed of or comprise tantalum nitride (TaN) or the like deposited conformally on capping layers 64 by ALD, CVD, or the like. The thickness of the capping layers 64 may be in a range between about 5 Å and about 30 Å, and the thickness of barrier layers 66 may be in a range between about 5 Å and about 30 Å.

Figure 10:
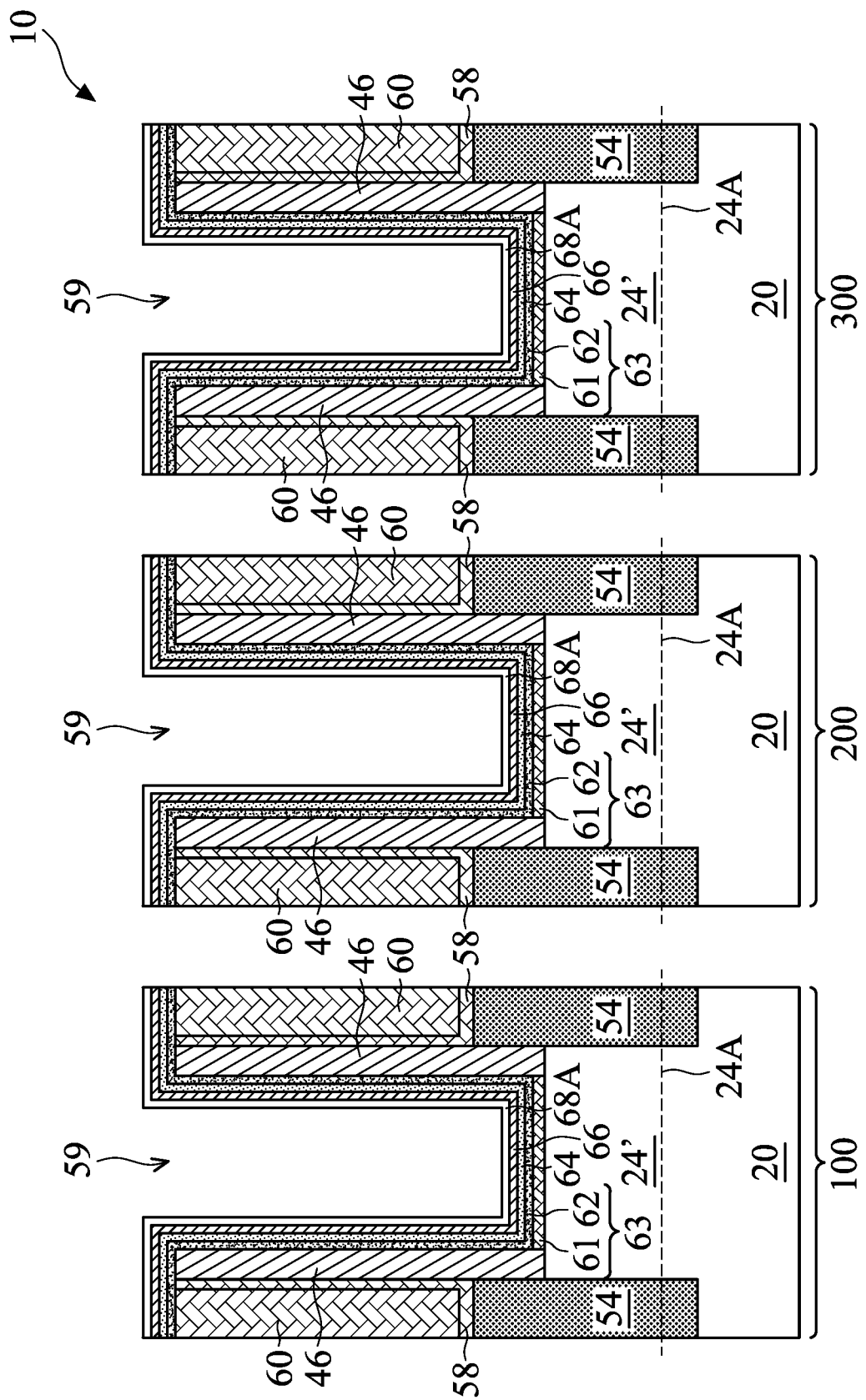

Referring to FIG. 10, a first work function tuning layer 68A is formed conformally on barrier layers 66. The respective process is illustrated as process 422 in the process flow 400 shown in FIG. 23. The first work function tuning layer 68A may be formed of any acceptable material to tune a work function of a device to a desired amount, depending on the application of the device to be formed, and may be deposited using any acceptable deposition process. In accordance with some embodiments, the first work function tuning layer 68A is formed of or comprises titanium nitride (TiN) or the like deposited by ALD, CVD, or the like. The first work function tuning layer 68A may be free from a doping element such as aluminum. A thickness of the first work function tuning layer 68A may be in a range between about 5 Å and about 30 Å.

Figure 11:
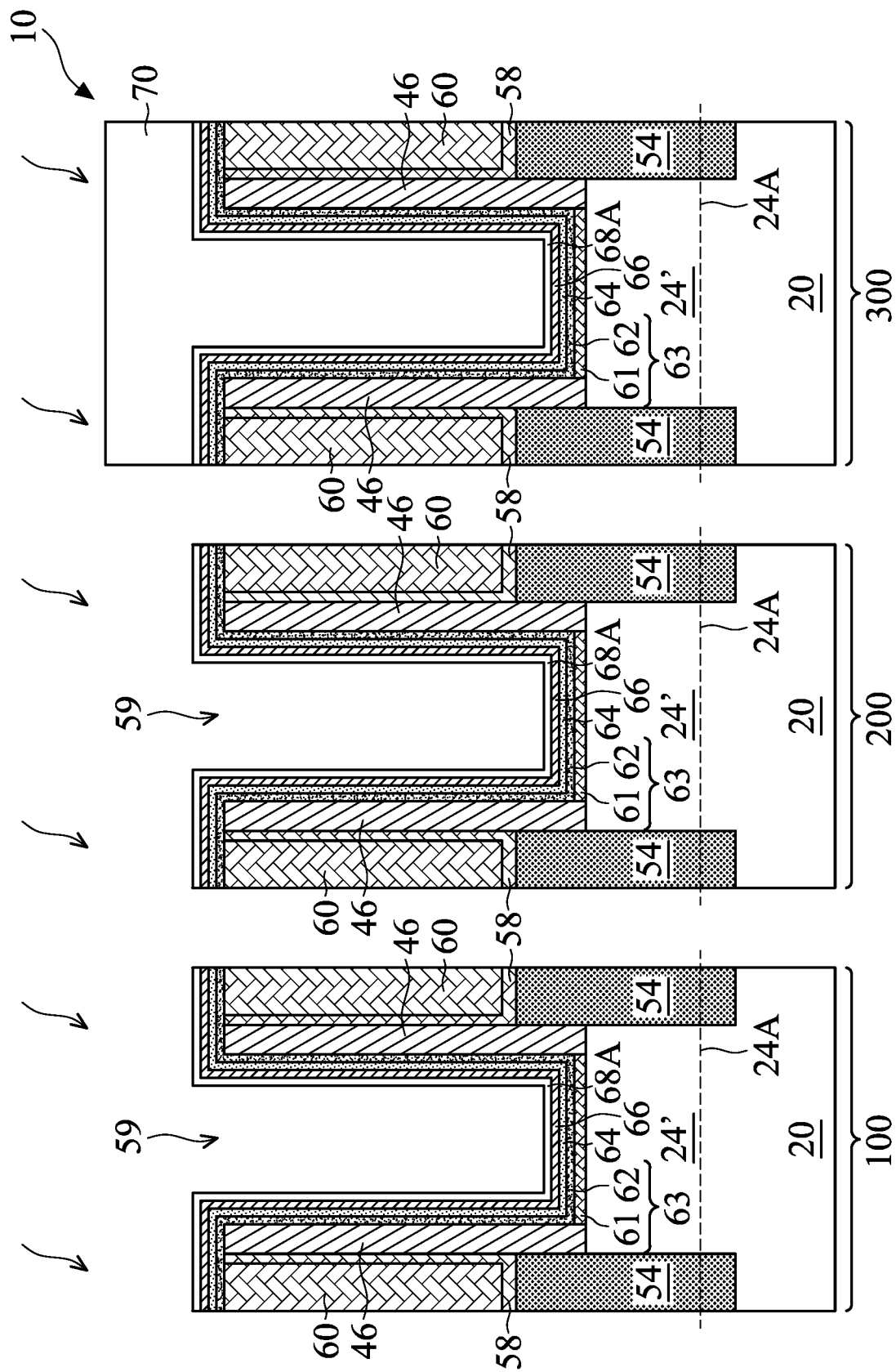

Referring to FIG. 11, etching mask 70 is formed, and is then patterned to cover device region 300, while leaving device regions 100 and 200 uncovered. Accordingly, the portions of work function tuning layer 68A in device regions 100 and 200 are exposed. In accordance with some embodiments, etching mask 70 comprises a photo resist.

Figure 12:
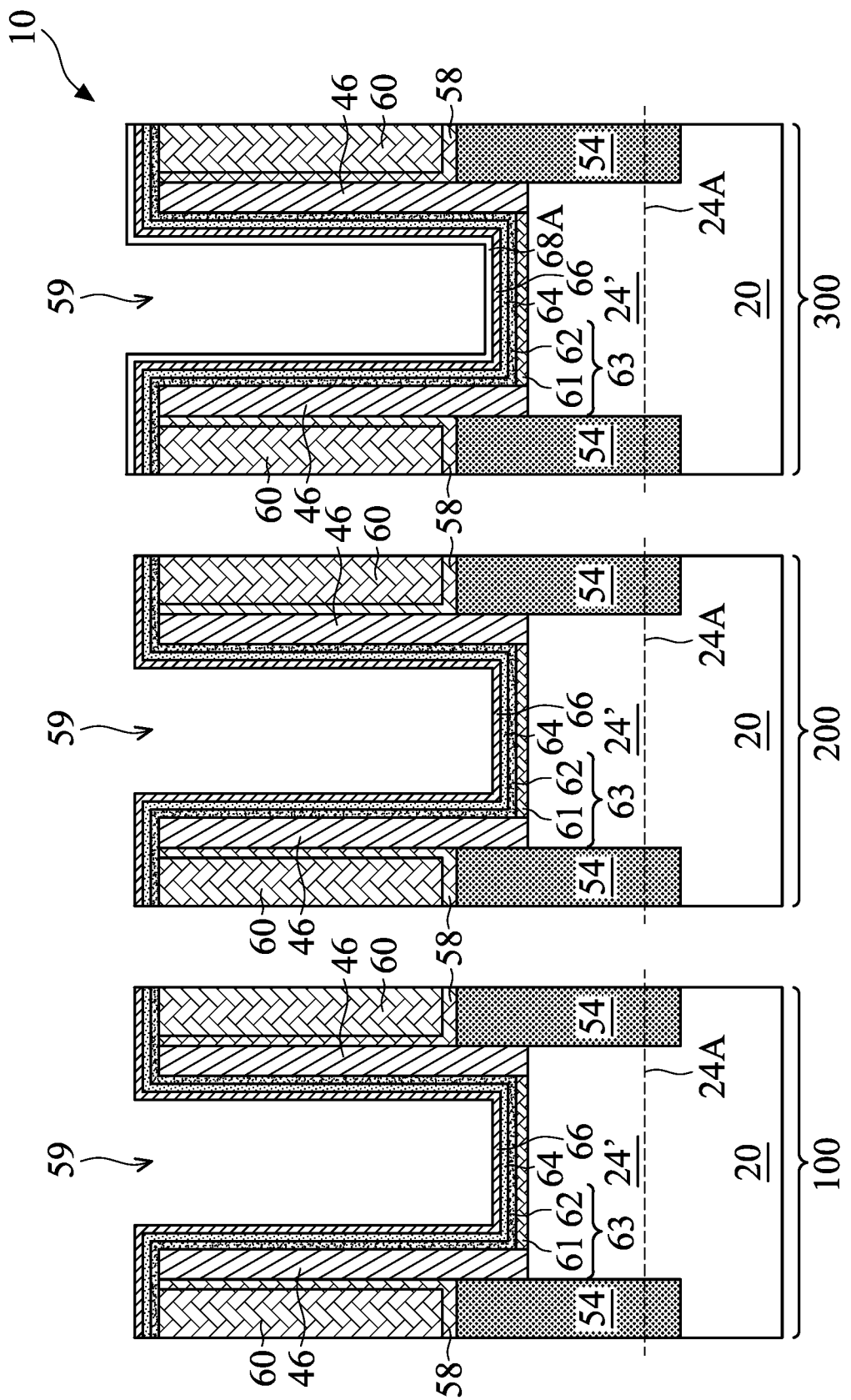

After the patterned etching mask 70 is formed, an etching process is performed to pattern the first work function tuning layer 68A. The respective process is illustrated as process 424 in the process flow 400 shown in FIG. 23. In the patterning process, the portions of the first work function tuning layer 68A are removed from the first device region 100 and second device region 200, leaving the portion of the first work function tuning layer 68A in device region 300. Barrier layers 66 may act as an etch stop layer during this etching process. In accordance with some embodiments, the first work function tuning layer 68A may be etched, for example, using a fluorine-containing chemical such as a hydrogen fluoride (HF) solution. Etching mask 70 is then removed, such as by using an appropriate ashing processing if etching mask 70 is a photo resist. The resulting structure is shown in FIG. 12.

Figure 13:
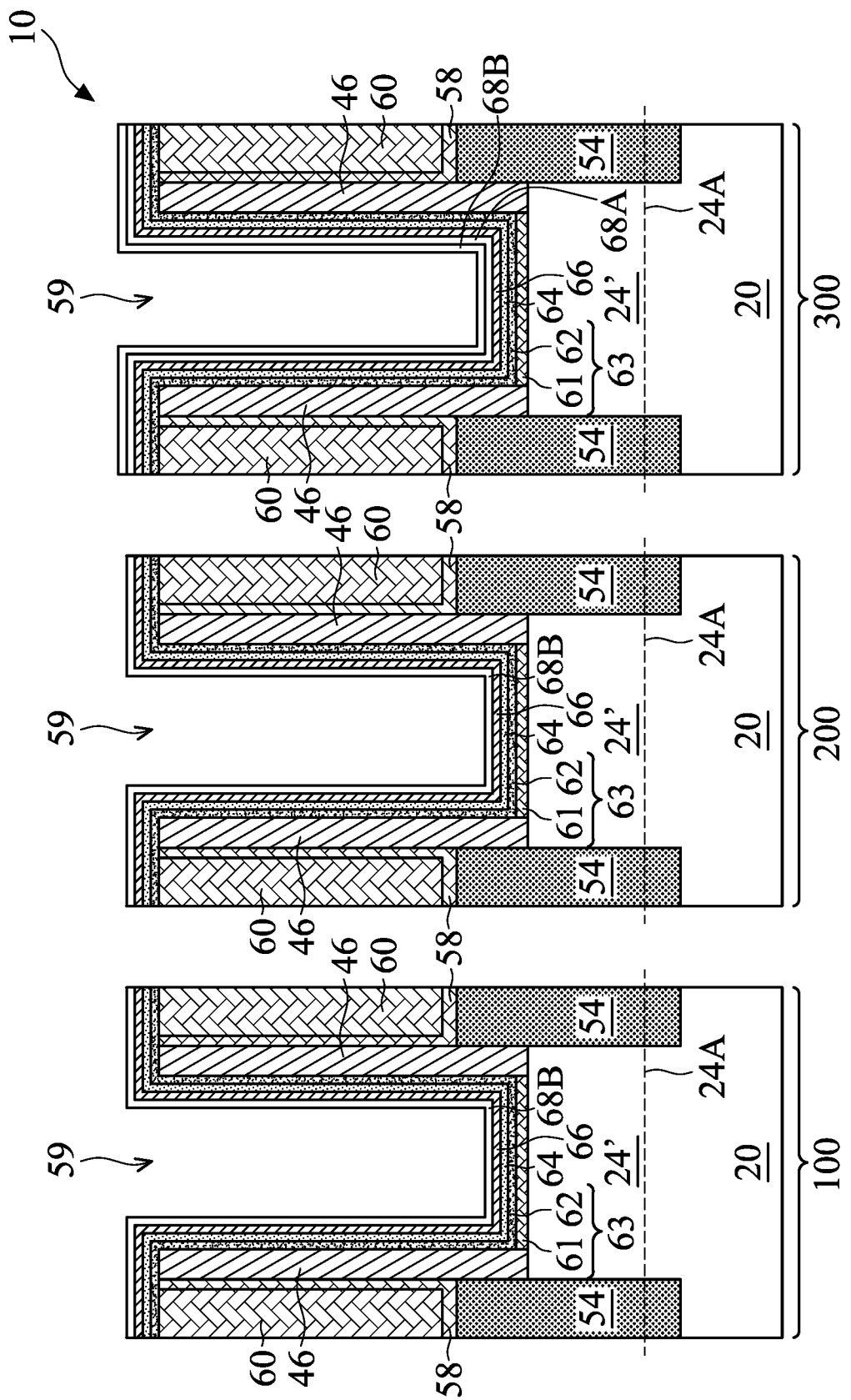

FIG. 13 illustrates the formation of a second work function tuning layer 68B, which is formed conformally and extend into device regions 100, 200, and 300. The respective process is illustrated as process 426 in the process flow 400 shown in FIG. 23. In device regions 100 and 200, the second work function tuning layer 68B may contact the top surface of barrier layer 66. In device region 300, the second work function tuning layer 68B may contact the first work function tuning layer 68A. The second work function tuning layer 68B may be formed of any acceptable material to tune a work function of a device to a desired value, depending on the application of the device to be formed, and may be deposited using any acceptable deposition method. In accordance with some embodiments, the second work function tuning layer 68B is deposited using CVD, ALD, or the like. The thickness of the second work function tuning layer 68B may be in a range between about 5 Å to about 30 Å.

Figure 15:
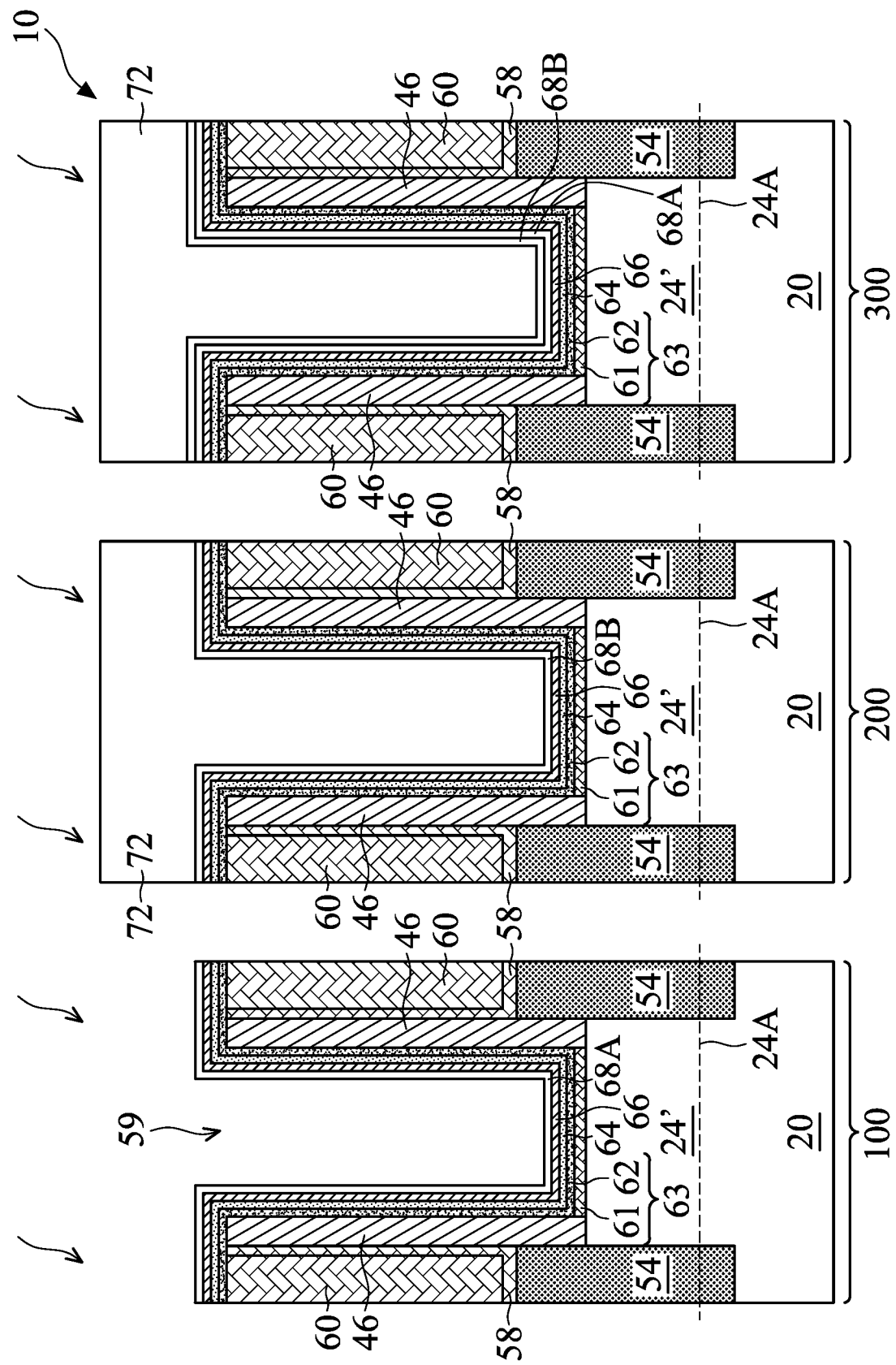

In accordance with some embodiments, the second work function tuning layer 68B comprises titanium nitride (TiN). The atomic ratio of titanium to nitride in the second work function tuning layer 68B may be the same as or different from the atomic ratio of titanium to nitride in the first work function tuning layer 68A. The work function tuning layers 68A and 68B may or may not be distinguished from each other. For example, there may be, or may not be, a distinguishable interface between work function tuning layers 68A and 68B. Work function tuning layer 68B may, or may not, include a doping element, which may be aluminum or another applicable element that may affect the etching selectivity (ES) between the second work function tuning layer 68B and barrier layer 66. More specifically, the doping element, when doped in the second work function tuning layer 68B, makes the etching rate of the second work function tuning layer 68B to be smaller (than if not doped) in the subsequent thinning process of barrier layer 66, as shown in FIG. 15. Furthermore, the first work function tuning layer 68A, as deposited, may be free from the doping element.

In accordance with some embodiments, the second work function tuning layer 68B comprises TiN, with aluminum doped, and hence the second work function tuning layer 68B is a TiAlN layer. The deposition of the second work function tuning layer 68B may be performed through CVD or ALD. The process gas for introducing titanium in TiAlN may be, for example, $TiCl_4$ or the like. The process gas for introducing nitrogen in TiAlN may include, for example, ammonia ($NH_3$) or the like. The process gas for introducing aluminum in TiAlN may include, for example, $AlCl_3$ or the like. In accordance with some embodiments of the present disclosure, the aluminum has an atomic percentage in the range between about 10 percent and about 20 percent.

In accordance with alternative embodiments, the second work function tuning layer 68B (as deposited) comprises TiN, and is free from the doping element such as aluminum, and the doping element is doped in a subsequent thermal soaking process. The deposition of the second work function tuning layer 68B may also be performed through CVD or ALD, wherein the precursors may include $TiCl_4$, ammonia, or the like. In accordance with some embodiments, during the deposition of work function tuning layer 68B, the temperature of wafer 10 is in the range between about 300° C. and about 550° C., or may be in the range between about 400° C. and about 450° C. The flow rate of $TiCl_4$ may be in the range between about 30 sccm and about 300 sccm. The flow rate of ammonia may be in the range between about 500 sccm and about 5,000 sccm.

Figure 14:
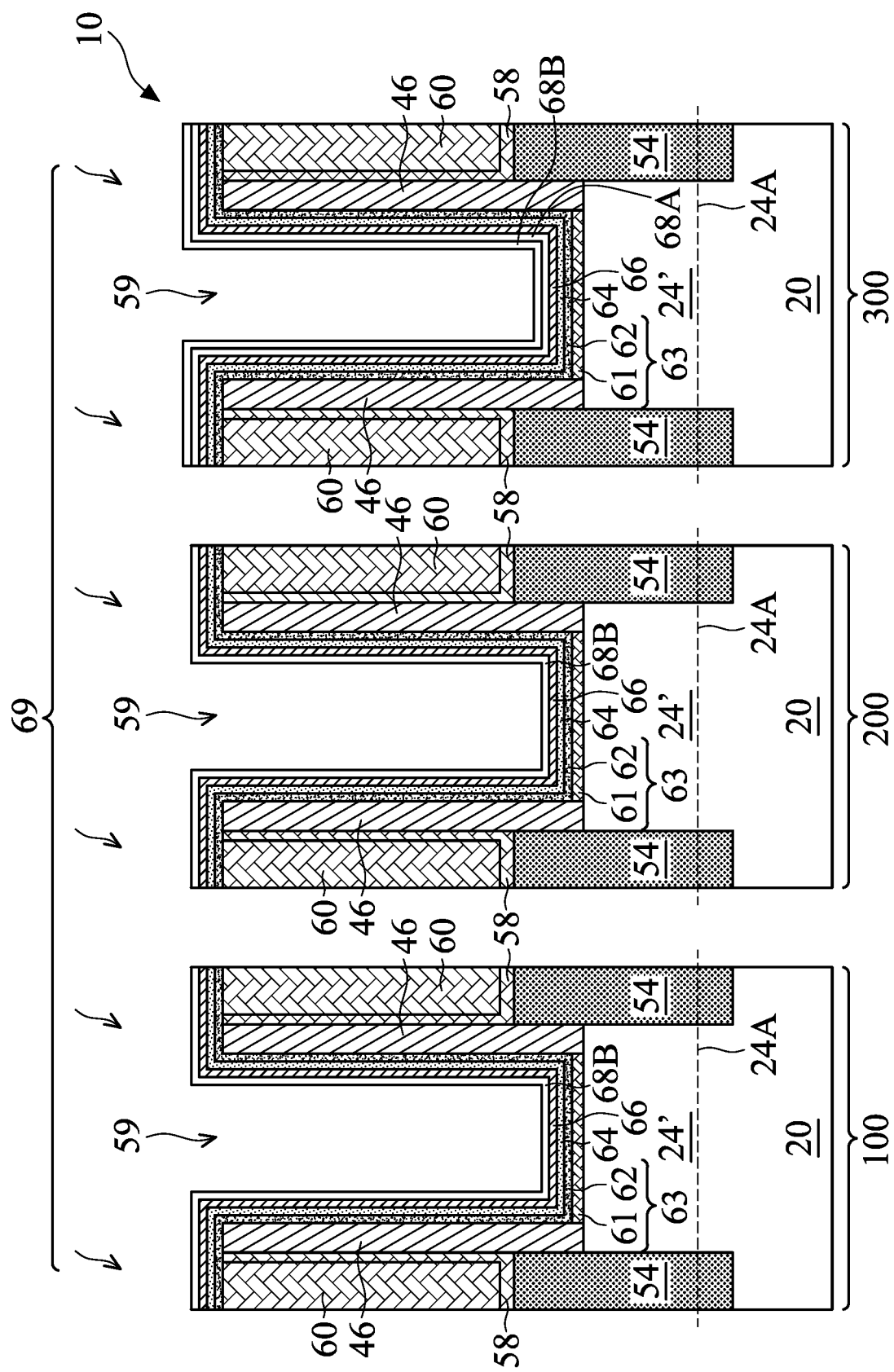
Figure 23:
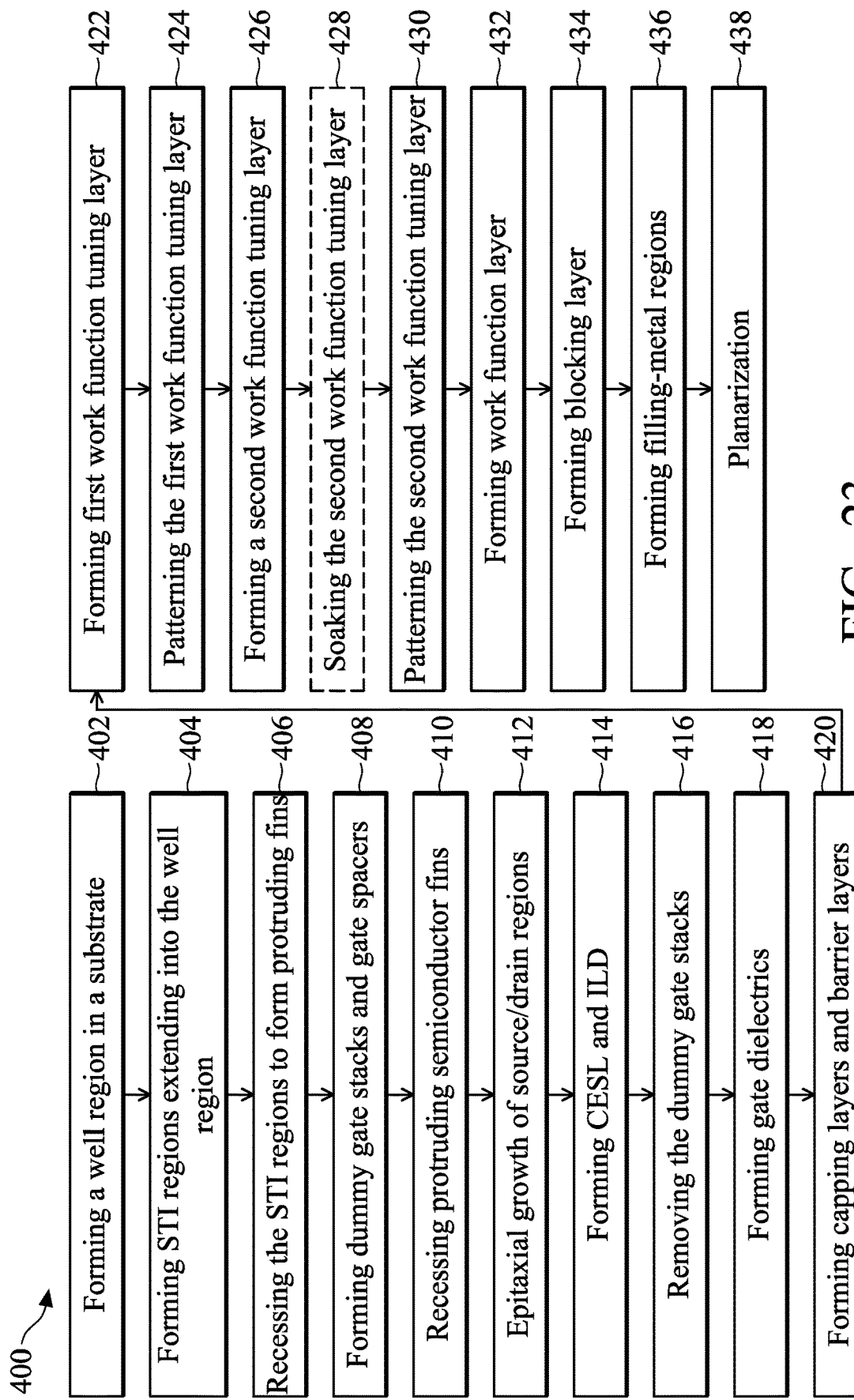
FIG. 23 illustrates a process flow for forming FinFETs in accordance with some embodiments.

Referring to FIG. 14, when work function tuning layer 68B is free from the doping element as deposited, a thermal soaking process (represented by arrows 69) is performed to dope the doping element into work function tuning layer 68B. The respective process is illustrated as process 428 in the process flow 400 shown in FIG. 23. In accordance with some embodiments in which the deposited second work function tuning layer 68B already comprises the doping element, the thermal soaking process may be performed or may be skipped. Accordingly, the process 428 as shown in the process flow 400 in FIG. 23 is marked using a dashed rectangle to indicate it may or may not be performed. In accordance with some embodiments, the process gases for the thermal soaking process comprise an aluminum-containing process gas such as $AlCl_3$ or the like, and may contain some carrier gases such $H_2$, Ar, or the like. In accordance with some embodiments, the thermal soaking process results in the doping element to reach a desirable atomic percentage (such as about 10 percent to about 20 percent) in work function tuning layer 68B, with no (or substantially no) doping element diffused into barrier layer 66 and first work function tuning layer 68A.

In accordance with some embodiments of the present disclosure, the thermal soaking process is performed with wafer 10 being at a temperature in the range between about 300° C. and about 550° C., or in the range between about 400° C. and about 450° C., the pressure of the process gas may be between about 0.5 torr and about 30 torr. The thermal soaking time may be in the range between about 1 second and about 300 seconds.

Referring to FIG. 15, etching mask 72 is formed, and is then patterned to cover device regions 200 and 300, while leaving device region 100 uncovered. Accordingly, the portion of work function tuning layer 68B in device region 100 is exposed. In accordance with some embodiments, etching mask 72 comprises a photo resist.

Figure 16:
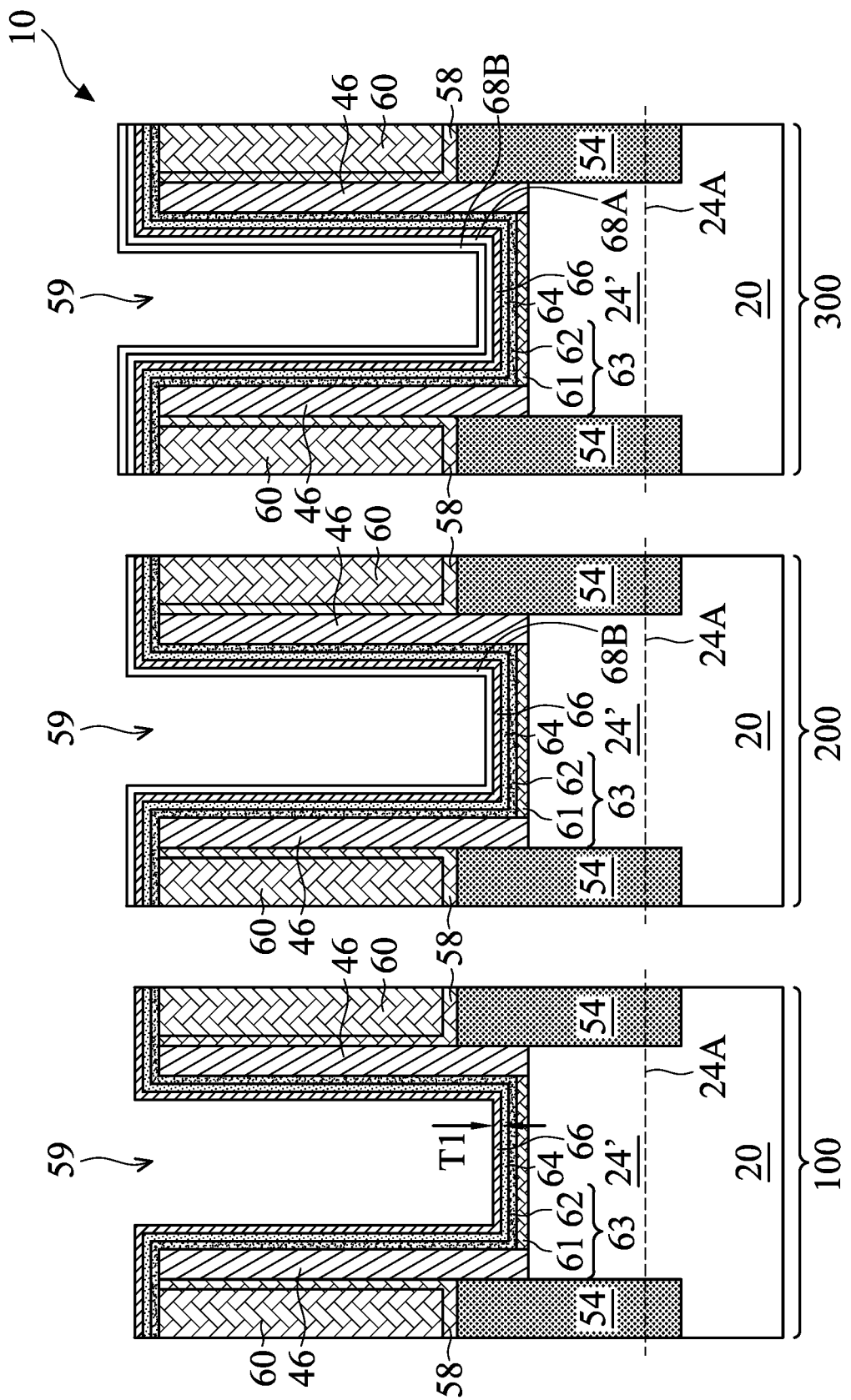

After the patterned etching mask 72 is formed, an etching process is performed to pattern work function tuning layer 68B. The respective process is illustrated as process 430 in the process flow 400 shown in FIG. 23. The portion of work function tuning layer 68B in device region 100 is removed, leaving the portions of work function tuning layer 68B in device regions 200 and 300. In the etching process, barrier layer 66 may act as an etch stop layer. In accordance with some embodiments, work function tuning layer 68B is etched, for example, using a fluorine-containing chemical such as a hydrogen fluoride (HF) solution. Etching mask 72 is then removed, such as by using an appropriate ashing processing if etching mask 72 is a photo resist. The resulting structure is shown in FIG. 16. In device region 100, barrier layer 66 is exposed. In device regions 200 and 300, work function tuning layer 68B is exposed.

Figure 17:
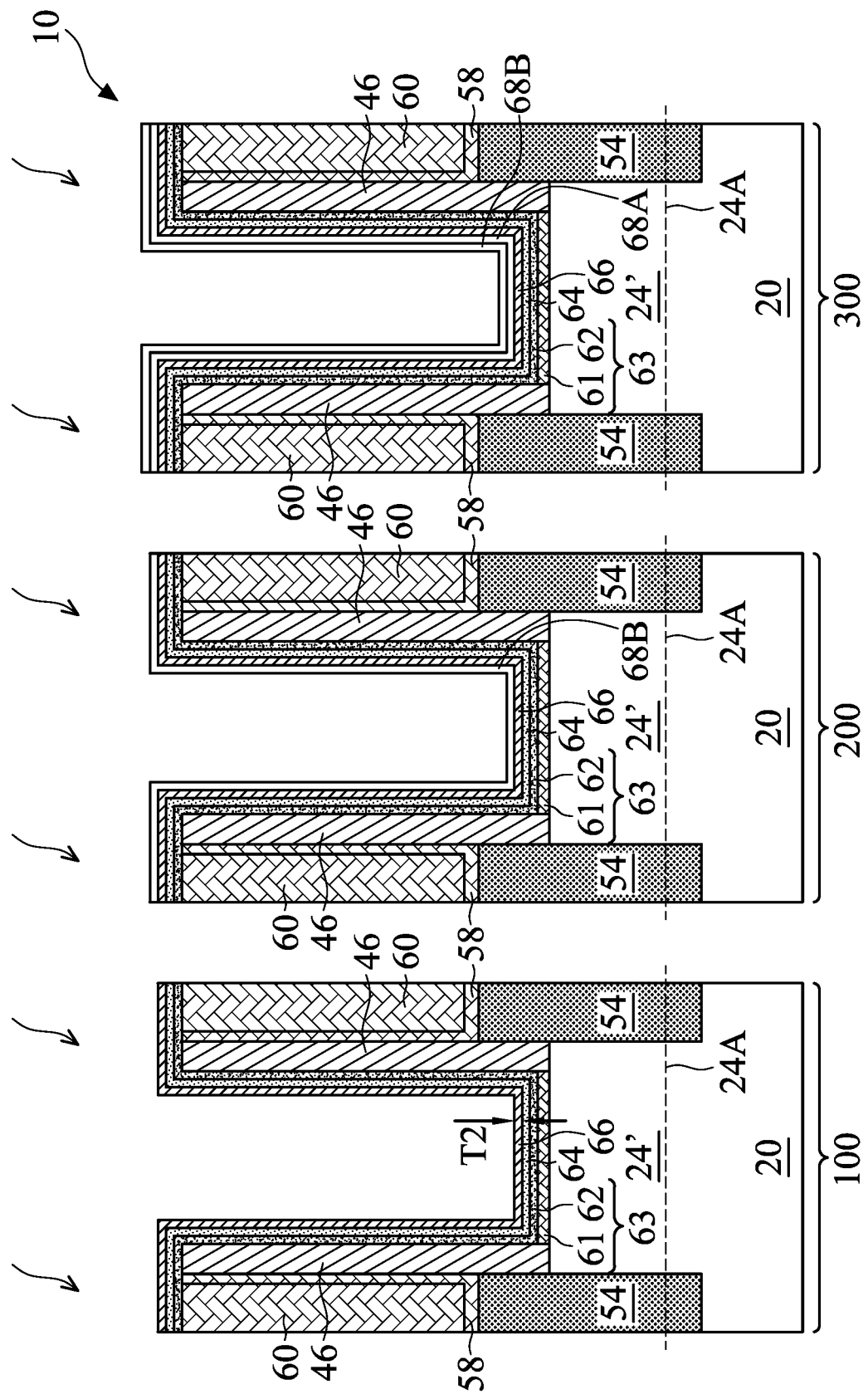

FIG. 17 illustrates a selective thinning process through etching, in which barrier layer 66 in device region 100 is thinned (partially or fully removed). In the etching process, the portion of barrier layer 66 in device region 100 and the portions of work function tuning layer 68B in device regions 200 and 300 are exposed to the etchant. The etchant is selected so that an etching selectivity ES, which is the ratio of the etching rate of barrier layer 66 to the etching rate of work function tuning layer 68B, is high. For example, etching selectivity ES may be higher than about 5, and may be in the range between about 5 and 10 or higher. It is appreciated that the etching process is performed after the removal of etching mask 72, rather than using etching mask 72 as an etching mask. The reason is that the etching may be performed at a high temperature, which may be high enough to cause the damage of etching mask 72, and the damaged etching mask 72 may pollute the etching chamber.

In accordance with some embodiments of the present disclosure, the etching of barrier layer 66 is performed using a chlorine-based chemical. In accordance with some embodiments, the selective etching is performed using a chlorine-based gas, which may be a metal-chloride gas such as $TiCl_x$, $TaCl_x$, $WCl_x$, the like, or a combination thereof. It is appreciated that $TiCl_x$, $TaCl_x$, and $WCl_x$ may be liquid or gas, depending on the temperature, and the liquid is evaporated into gas at a high temperature. The selective etching process may be a thermal etching process without generating plasma. In accordance with some embodiments, when the chlorine-based gas is used for the selective etching, the temperature of wafer 10 may be in a range between about 200° C. and about 600° C., with a flow rate of the chlorine-based gas being in a range between about 100 sccm and about 10,000 sccm. The etching duration may be in a range between about 10 seconds to about 300 seconds, such as between about 30 seconds and about 120 seconds.

The etching results in the thickness of the portion of barrier layer 66 in device region 100 to be reduced from thickness T1 (FIG. 16) before the etching to thickness T2 (FIG. 17) after the etching. Ratio T2/T1 may be smaller than about 0.7, or smaller than about 0.5. Ratio T2/T1 may also be 0, which means the portion of barrier layer 66 in device region 100 is removed. The ratio may also be in the range between about 0.1 and about 0.5. For example, the thickness T1 before the etching may be in the range between about 5 Å to about 30 Å, and thickness T2 may be in the range between about 2 Å and about 10 Å.

As aforementioned, due to the doping of the doping element, the etching selectivity ES is increased, for example, to a value in the range between about 5 and about 10. Accordingly, in the selective etching, the reduction in the thickness of work function tuning layer 68B in device regions 200 and 300 is small.

Figure 22A:
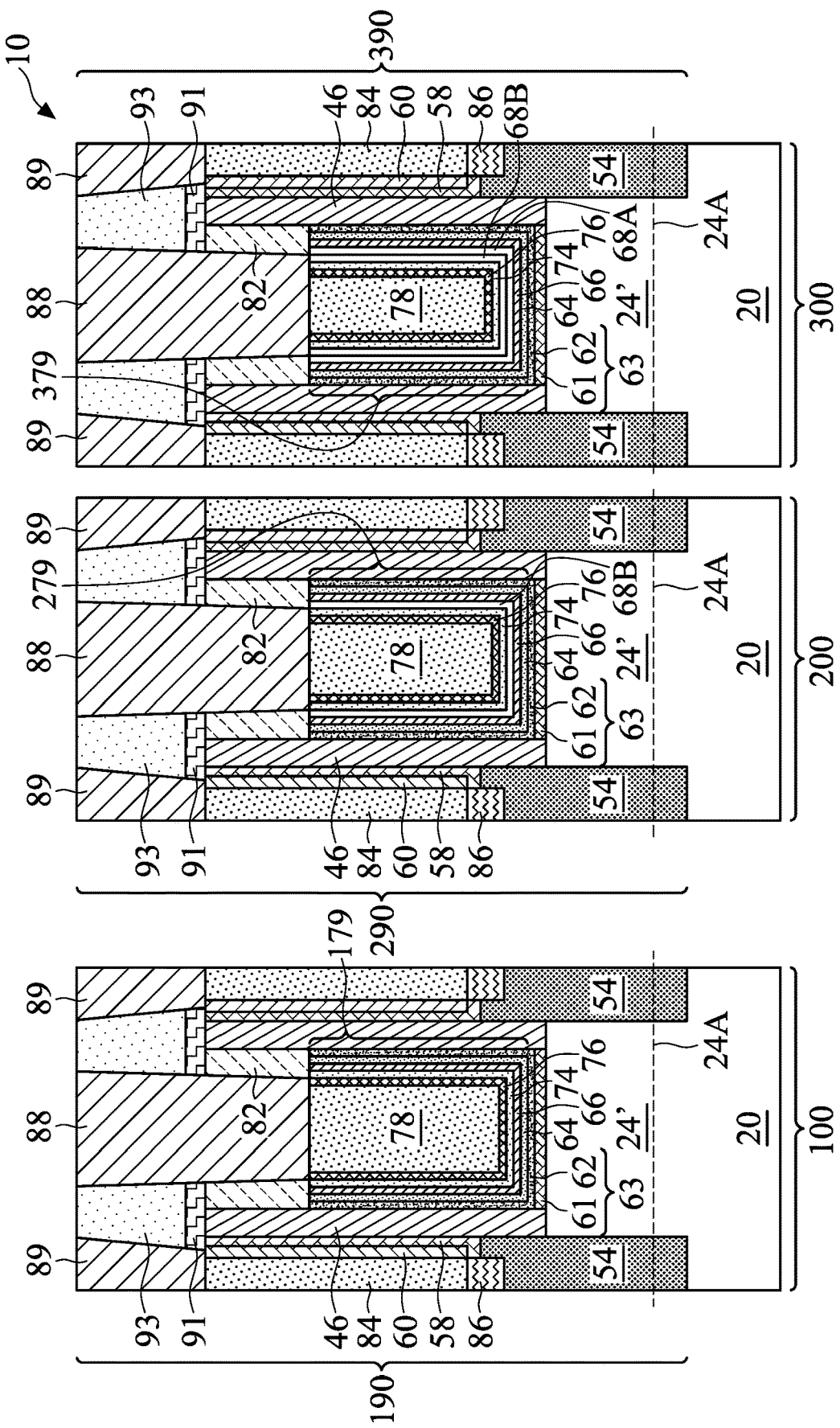

The thicknesses of barrier layers 66 and work function tuning layers 68A and 68B affects the threshold voltages of the corresponding FinFETs 190, 290, and 390 (FIG. 22A). For example, when FinFETs 190, 290, and 390 are n-type FinFETs, the reduction of barrier layers 66 and work function tuning layers 68A and 68B results in the lowering of the threshold voltages of the corresponding FinFETs 190, 290, and 390. When barrier layer 66 is etched, the threshold voltage of the FinFET 190 is reduced. It is desirable that the threshold voltages of the FinFETs 190, 290, and 390 have large spread to satisfy the requirement of different circuits. In the etching of barrier layer 66, if work function tuning layers 68B in device regions 200 and 300 are etched too much, the threshold voltages of FinFETs 290 and 390 (FIG. 22A) will also be reduced too much, resulting in the spread between the threshold voltages of FinFET 190 and the threshold voltages of FinFETs 290 and 390 to be undesirably reduced. The spread between the threshold voltages of FinFETs 190, 290, and 390 are thus maintained.

When FinFETs 190, 290, and 390 are p-type FinFETs, the thinning of barrier layers 66 and work function tuning layers 68A and 68B results in the increase of the threshold voltages of FinFETs 190, 290, and 390. By doping work function tuning layer 68B, when barrier layer 66 is etched, due to the high etching selectivity ES, the reduction in the thickness of work function tuning layer 68B is reduced, and the increase in the threshold voltage of FinFETs 290 and 390 is reduced. The threshold voltage spread is also maintained. Experiment results have indicated that if work function tuning layer 68B is not doped with the doping element, the etching selectivity ES is around 3, and when work function tuning layer 68B is doped, for example, with aluminum, the etching selectivity ES is increased to about 5 to 10. The thickness loss of work function tuning layer 68B is significantly reduced, resulting in the change $\Delta V_{FB}$ in the flat band voltage $V_{FB}$ of the resulting FinFET (when layer 68B is doped) to be about ⅐ of the $\Delta V_{FB}$ of the resulting FinFET (when layer 68B is not doped).

Figure 18:
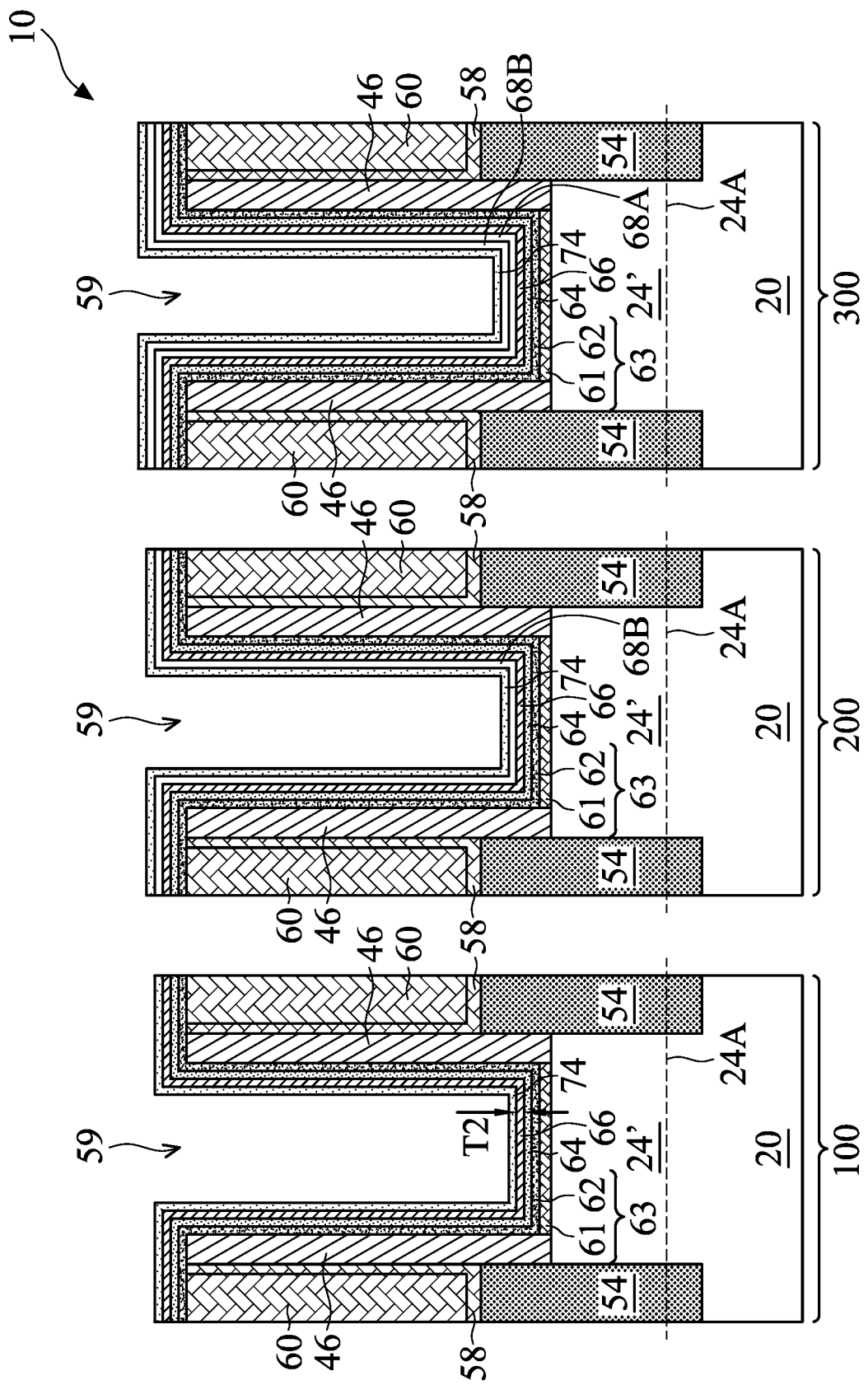

Referring to FIG. 18, work-function layer 74 is formed conformally and extending into device regions 100, 200, and 300. Work-function layer 74 may be formed through ALD, CVD, or the like. The respective process is illustrated as process 432 in the process flow 400 shown in FIG. 23. Work-function layer 74 may be a single layer having a homogenous composition (having same elements with same percentages of the same elements), or may include a plurality of sub-layers formed of different materials. Work-function layer 74 may include work-function metals that are selected according to whether the respective FinFETs formed in device regions 100, 200 and 300 are n-type FinFETs or p-type FinFETs. For example, when the FinFETs are n-type FinFETs, work-function layer 74 may include an aluminum-based layer (formed of or comprising, for example, TiAl, TiAlN, TiAlC, TaAlN, or TaAlC). The aluminum-based layer may be, or may not be, in contact with barrier layer 66 (in device region 200) and work function tuning layer 68B (in device region 200). When the FinFETs are p-type FinFET, work-function layer 74 may be, or may not be, free from aluminum-containing layers. For example, work-function layer 74 of the p-type FinFETs may include a TiN layer, a TaN layer, and another TiN layer, and may be free from aluminum-containing materials. The portion of work-function layer 74 free from aluminum may be in contact with work function tuning layer 68B. In accordance with some embodiments, the portions of work-function layer 74 in device regions 100, 200, and 300 are formed of a same material, and may, or may not, be formed in a common deposition process. In accordance with alternative embodiments, the portions of work-function layer 74 in device regions 100, 200, and 300 are formed of different materials, which are formed in separate deposition processes. For example, each of the portions of work-function layer 74 in device regions 100, 200, and 300 may be formed of a p-type work function material and an n-type work function material in any combination.

Regardless of whether the FinFETs in device regions 200 and 300 are n-type FinFETs or p-type FinFETs, work-function layer 74 may not include aluminum (as deposited, which is before any subsequent anneals), or work-function layer 74 may include an aluminum-containing sub-layer, but the aluminum-containing layer is separated from work function tuning layer 68B by an aluminum-free sub-layer (as deposited) that is in contact with work function tuning layer 68B. Accordingly, although subsequent thermal processes may cause aluminum to diffuse, work function tuning layer 68B may still have a higher atomic percentage (concentration) of aluminum than the overlying aluminum-free sub-layer and the underlying layer (barrier layer 66 in device region 200 or work function tuning layer 68A in device region 300).

Figure 19:
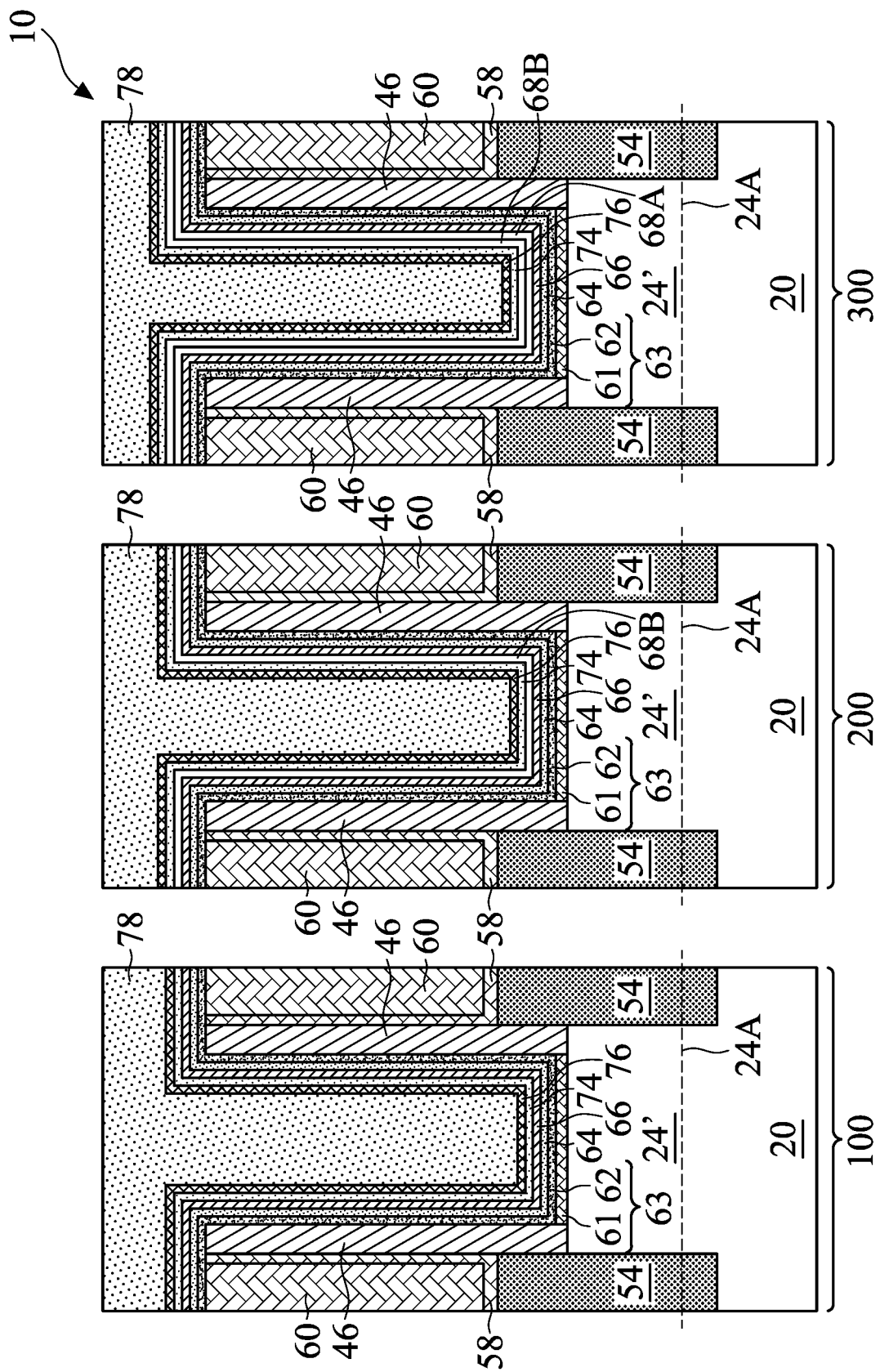

Referring to FIG. 19, blocking layer 76 (which is also a barrier layer) is formed conformally and extending into device regions 100, 200, and 300. The respective process is illustrated as process 434 in the process flow 400 shown in FIG. 23. In accordance with some embodiments, blocking layer 76 comprises titanium nitride (TiN) or the like deposited by ALD, CVD or the like. A thickness of blocking layer 76 may be in a range from about 5 Å to about 50 Å.

Figure 20:
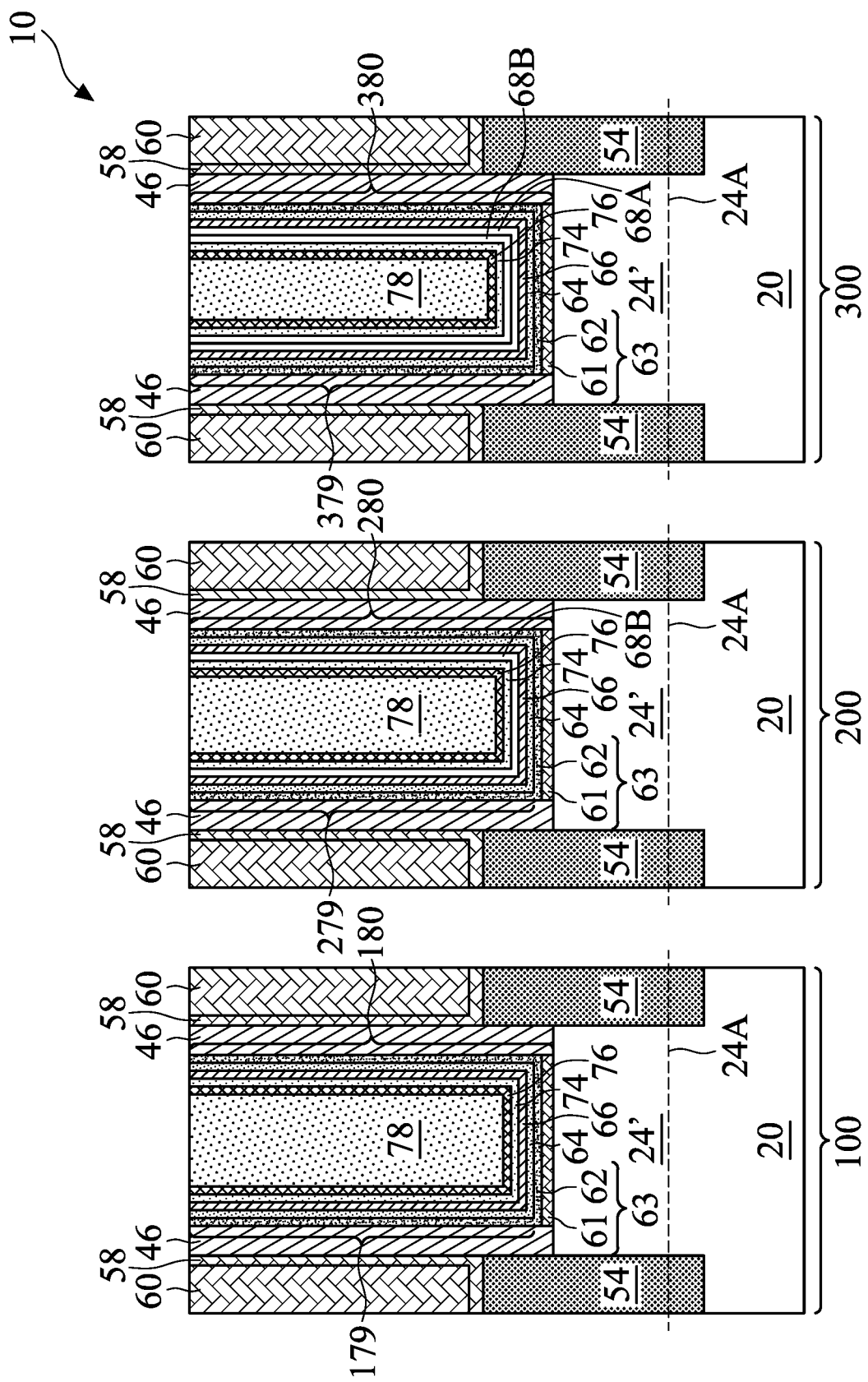

FIG. 19 also illustrates the formation of filling-metal regions 78. In accordance with some embodiments, filling-metal regions 78 are formed of tungsten, cobalt, or the like which may be deposited using ALD, CVD, or combinations thereof. The respective process is illustrated as process 436 in the process flow 400 shown in FIG. 23. After the formation of filling-metal regions 78, a planarization process may be performed to remove excess portions of the deposited layers as shown in FIG. 19, resulting in the gate stacks 180, 280, and 380 as shown in FIG. 20. The respective process is illustrated as process 438 in the process flow 400 shown in FIG. 23. Gate stacks 180, 280, and 380 include gate electrodes 179, 279, and 379, respectively. Gate electrode 179 includes capping layer 64, barrier layer 66, work function layer 74, blocking layer 76, and filling-metal region 78. Gate electrode 279 includes capping layer 64, barrier layer 66, work function tuning layer 68B, work function layer 74, blocking layer 76, and filling-metal region 78. Gate electrode 379 includes capping layer 64, barrier layer 66, work function tuning layers 68A and 68B, work function layer 74, blocking layer 76, and filling-metal region 78.

Figure 21:
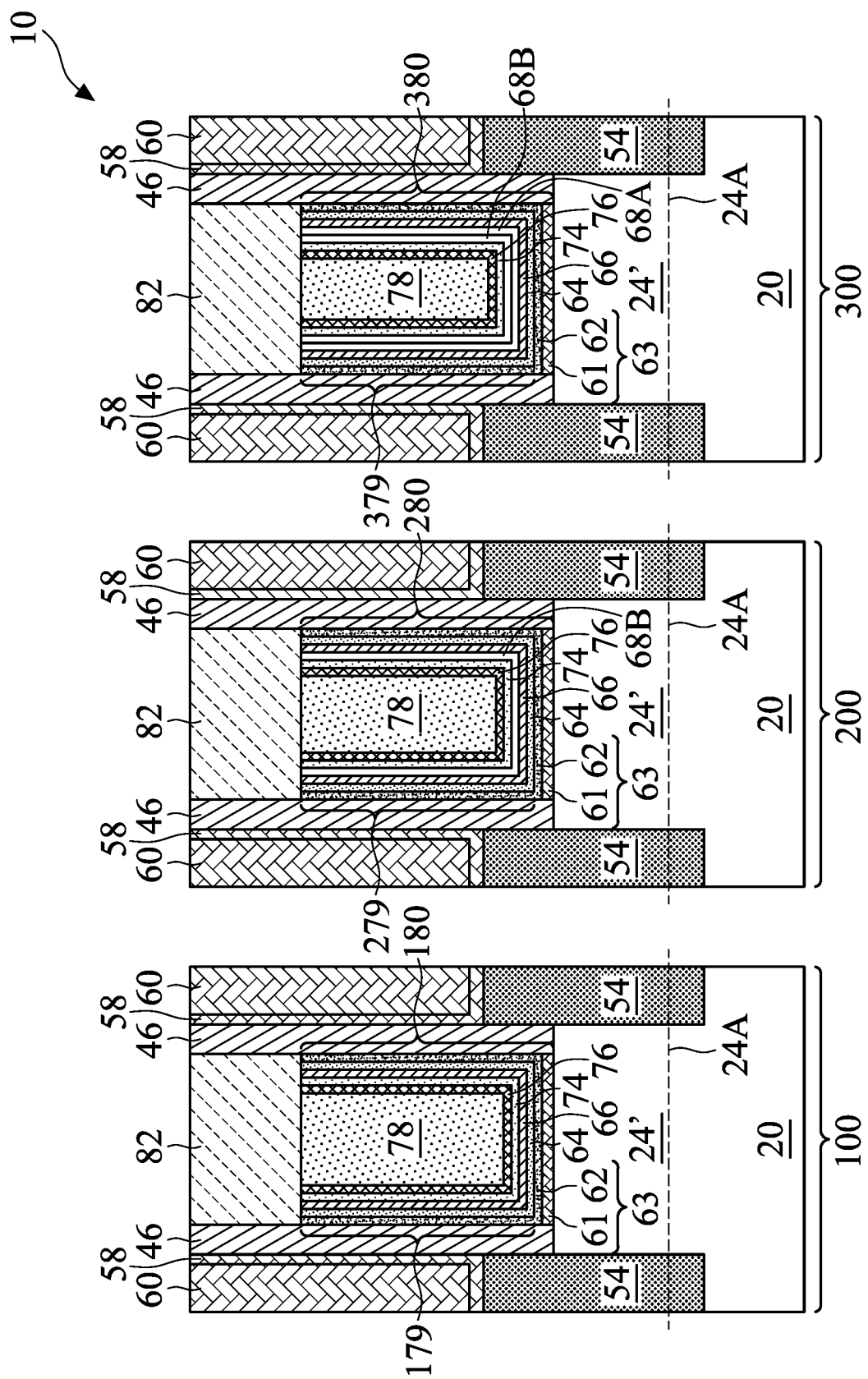

FIG. 21 illustrates the formation of hard masks 82 in accordance with some embodiments. The formation of hard masks 82 may include performing an etching process to recess gate stacks 180, 280, and 380, so that recesses are formed between gate spacers 46, filling the recesses with a dielectric material, and then performing a planarization process such as a CMP process or a mechanical grinding process to remove excess portions of the dielectric material. Hard masks 82 may be formed of silicon nitride, silicon oxynitride, silicon oxy-carbo-nitride, or the like.

FIG. 22A illustrates the formation of source/drain contact plugs 84 and silicide regions 86. The formation of source/drain contact plugs 84 include etching ILD 60 to expose the underlying portions of CESL 58, and then etching the exposed portions of CESL 58 to form contact openings, through which source/drain regions 54 are revealed. In a subsequent process, a metal layer (such as a Ti layer) is deposited and extending into the contact openings. A metal nitride capping layer may be performed. An anneal process is then performed to react the metal layer with the top portion of source/drain regions 54 to form silicide regions 86, as shown in FIG. 22A. A filling-metallic material such as tungsten, cobalt, or the like, is then filled into the contact openings, followed by a planarization to remove excess materials, resulting in source/drain contact plugs 84. Etch stop layer 91 and ILD 93 may then be deposited. Gate contact plugs 88 are also formed to penetrate hard masks 82 to contact gate electrodes 179, 279, and 379. Source/drain contact plugs 89 are also formed. FinFETs 190, 290, and 390 are thus formed.

Figure 22B:
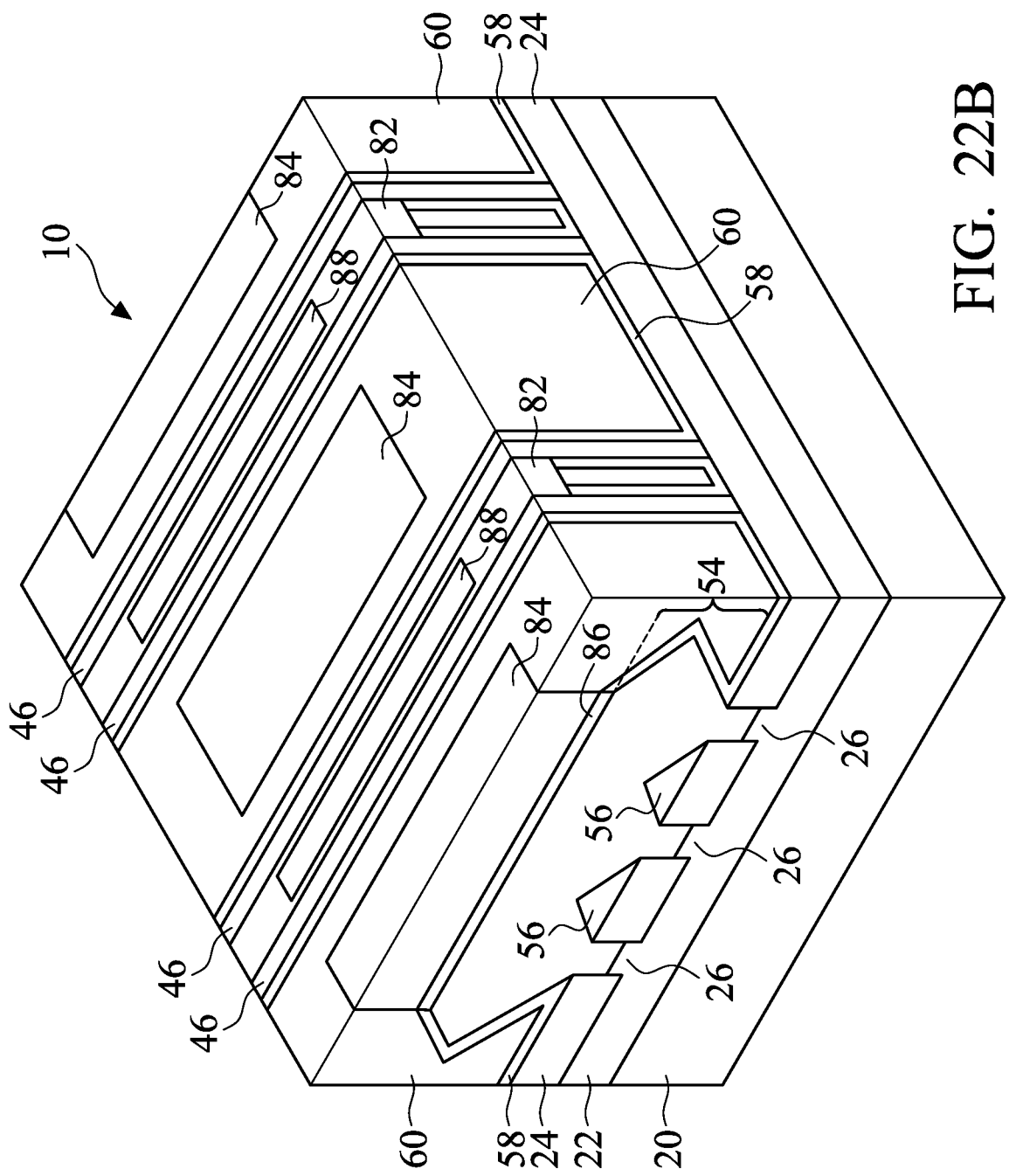

FIG. 22B illustrates a perspective view of a FinFET, which may represent either one of FinFETs 190, 290, and 390 as shown in FIG. 22A. Gate contact plug 88, source/drain silicide regions 86, and source/drain contact plugs 84 are also illustrated.

The embodiments of the present disclosure have some advantageous features. The integrated circuit may have transistors with different threshold voltages. It is desirable that the spread between the threshold voltages of transistors is significant. By doping the work function tuning layer with a doping element such as aluminum, when the barrier layer of one transistor is etched, the adverse etching of the exposed work function tuning layers in other transistors is reduced, and the adverse reduction in the spread of the thresholds is reduced.

In accordance with some embodiments of the present disclosure, a method includes forming a gate dielectric comprising a first portion extending on a first semiconductor region; forming a barrier layer comprising a first portion extending over the first portion of the gate dielectric; forming a first work function tuning layer comprising a first portion over the first portion of the barrier layer; doping a doping element into the first work function tuning layer; removing the first portion of the first work function tuning layer; thinning the first portion of the barrier layer; and forming a work function layer over the first portion of the barrier layer. In an embodiment, the first work function tuning layer comprises titanium nitride, and the doping element comprises aluminum. In an embodiment, the doping the doping element comprises in-situ doping aluminum when the first work function tuning layer is deposited. In an embodiment, the doping the doping element is performed after the first work function tuning layer is deposited. In an embodiment, the doping the doping element comprises thermal soaking the first work function tuning layer in an aluminum-containing gas. In an embodiment, the gate dielectric further comprises a second portion extending on a second semiconductor region, the barrier layer further comprises a second portion extending over the second portion of the gate dielectric, and the first work function tuning layer further comprises a second portion extending over the second portion of the barrier layer, and wherein when the first portion of the first work function tuning layer is removed, the second portion of the first work function tuning layer is protected by an etching mask from being removed. In an embodiment, when the first portion of the barrier layer is thinned, the second portion of the barrier layer is protected by the second portion of the first work function tuning layer. In an embodiment, the method further includes before the first work function tuning layer is formed, forming a second work function tuning layer; and after the second work function tuning layer is formed, patterning the second work function tuning layer to remove a portion of the second work function tuning layer overlapping the first portion of the barrier layer.

In accordance with some embodiments of the present disclosure, a method includes depositing a barrier layer comprising a first portion and a second portion in a first transistor region and a second transistor region, respectively; depositing a first titanium nitride layer comprising a first portion and a second portion overlapping the first portion and the second portion, respectively, of the barrier layer; doping aluminum into the first titanium nitride layer; removing the first portion of the first titanium nitride layer, and leaving the second portion of the first titanium nitride layer unremoved; partially etching the barrier layer to reduce a thickness of the first portion of the barrier layer, wherein the second portion of the barrier layer is protected by the second portion of the first titanium nitride layer; and forming a work function layer comprising a first portion contacting the first portion of the barrier layer, and a second portion contacting the second portion of the first titanium nitride layer. In an embodiment, the barrier layer further comprises a third portion in a third transistor region, and the first titanium nitride layer further comprises a third portion over the third portion of the barrier layer, and the method further comprises, before the first titanium nitride layer is formed, depositing a second titanium nitride layer comprising a first portion, a second portion, and a third portion overlapping the first portion, the second portion, and the third portion, respectively, of the barrier layer; and before the first titanium nitride layer is formed, removing the first portion and the second portion of the second titanium nitride layer. In an embodiment, no aluminum is doped into the second titanium nitride layer before the first titanium nitride layer is formed. In an embodiment, the doping the aluminum into the first titanium nitride layer comprises thermally soaking the first titanium nitride layer in an aluminum-containing gas. In an embodiment, the partially etching the barrier layer is performed using a metal-chloride gas. In an embodiment, in the partially etching the barrier layer, the thickness of the first portion of the barrier layer is reduced by a percentage in a range between about 50 percent and about 90 percent. In an embodiment, during the partially etching the barrier layer, the second portion of the first titanium nitride layer is exposed to a same etching gas for etching the barrier layer.

In accordance with some embodiments of the present disclosure, an integrated circuit device includes a semiconductor region; a gate dielectric over the semiconductor region; a barrier layer over the gate dielectric; a first titanium nitride layer over the barrier layer, wherein the first titanium nitride layer further comprises aluminum therein; and a work function layer over the first titanium nitride layer, wherein an aluminum atomic percentage of the first titanium nitride layer is higher than aluminum atomic percentages in an overlying layer overlaying and contacting the first titanium nitride layer, and an underlying layer underlying and contacting the first titanium nitride layer. In an embodiment, the overlying layer is the work function layer. In an embodiment, the integrated circuit device further includes a second titanium nitride layer between the first titanium nitride layer and the barrier layer, wherein the underlying layer is the second titanium nitride layer. In an embodiment, the work function layer, the first titanium nitride layer, the barrier layer, and the gate dielectric are comprised in a p-type transistor. In an embodiment, the underlying layer is the barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gate dielectric comprising a first portion extending on a first semiconductor region;
   forming a barrier layer comprising a first portion extending over the first portion of the gate dielectric;
   forming a first work function tuning layer comprising a first portion over the first portion of the barrier layer;
   doping a doping element into the first work function tuning layer, wherein the doping element comprises aluminum;
   removing the first portion of the first work function tuning layer, wherein the first portion of the first work function tuning layer extends into a trench between gate spacers, and a first bottom part of the first portion of the first work function tuning layer at a bottom of the trench is removed;
   after the first portion of the first work function tuning layer is removed, thinning the first portion of the barrier layer, wherein a second bottom part of the barrier layer at the bottom of the trench is thinned; and
   after the thinning, forming a work function layer over the first portion of the barrier layer, wherein the work function layer comprises aluminum.

2. The method of claim 1, wherein both of the removed first portion of the first work function tuning layer and the work function comprise TiAlN.

3. The method of claim 1, wherein the doping the doping element comprises in-situ doping aluminum when the first work function tuning layer is deposited.

4. The method of claim 1, wherein the doping the doping element is performed after the first work function tuning layer is deposited.

5. The method of claim 4, wherein the doping the doping element comprises thermal soaking the first work function tuning layer in an aluminum-containing gas.

6. The method of claim 1, wherein the gate dielectric further comprises a second portion extending on a second semiconductor region, the barrier layer further comprises a second portion extending over the second portion of the gate dielectric, and the first work function tuning layer further comprises a second portion extending over the second portion of the barrier layer, and wherein when the first portion of the first work function tuning layer is thinned, the second portion of the barrier layer is protected by the first work function tuning layer that comprise aluminum.

7. The method of claim 6, wherein when the first portion of the barrier layer is thinned, the second portion of the barrier layer is protected by the second portion of the first work function tuning layer.

8. The method of claim 1 further comprising:
before the first work function tuning layer is formed, forming a second work function tuning layer; and
after the second work function tuning layer is formed, patterning the second work function tuning layer to remove a portion of the second work function tuning layer overlapping the first portion of the barrier layer.

9. A method comprising:
removing a first dummy gate stack and a second dummy gate stack to form a first trench and a second trench, respectively, in a dielectric layer, wherein the first trench and the second trench are in a first transistor region and a second transistor region, respectively;
depositing a barrier layer comprising a first portion and a second portion extending into the first trench and the second trench, respectively;
depositing a first titanium nitride layer comprising a first portion and a second portion overlapping the first portion and the second portion, respectively, of the barrier layer;
doping aluminum into the first titanium nitride layer;
removing the first portion of the first titanium nitride layer, wherein an entirety of the first portion of the first titanium nitride layer in the first trench is removed, and the second portion of the first titanium nitride layer in the second trench is left unremoved;
partially etching the barrier layer at a bottom of the first trench to reduce a thickness of the first portion of the barrier layer, wherein the second portion of the barrier layer is protected by the second portion of the first titanium nitride layer; and
forming a work function layer comprising a first portion directly contacting the first portion of the barrier layer, and a second portion directly contacting the second portion of the first titanium nitride layer.

10. The method of claim 9, wherein the barrier layer further comprises a third portion in a third transistor region, and the first titanium nitride layer further comprises a third portion over the third portion of the barrier layer, and the method further comprises:
before the first titanium nitride layer is formed, depositing a second titanium nitride layer comprising a first portion, a second portion, and a third portion overlapping the first portion, the second portion, and the third portion, respectively, of the barrier layer; and before the first titanium nitride layer is formed, removing the first portion and the second portion of the second titanium nitride layer.

11. The method of claim 10, wherein the work function layer comprises aluminum.

12. The method of claim 9, wherein the doping the aluminum into the first titanium nitride layer comprises thermally soaking the first titanium nitride layer in an aluminum-containing gas.

13. The method of claim 9, wherein in the partially etching the barrier layer, the second portion of the first titanium nitride layer that comprises aluminum is used as an etching mask to protect the second portion of the barrier layer the partially.

14. The method of claim 9, wherein in the partially etching the barrier layer, the thickness of the first portion of the barrier layer at the bottom of the first trench is reduced by a percentage in a range between about 50 percent and about 90 percent.

15. The method of claim 9, wherein both of the removed first portion of the first titanium nitride layer and the work function layer comprise TiAlN.

16. A method comprising:
forming a barrier layer comprising a first portion on a first semiconductor fin;
depositing a work function tuning layer comprising a first portion over the first portion of the barrier layer;
after the work function tuning layer is deposited, thermal soaking the work function tuning layer in an aluminum-containing gas;
removing the first portion of the work function tuning layer that has been soaked with aluminum;
after the first portion of the work function tuning layer is removed, thinning the first portion of the barrier layer;
after the thinning, depositing a work function layer over the first portion of the barrier layer, wherein the work function layer comprises aluminum; and
performing a planarization process to remove portions of the barrier layer and the work function layer to form a replacement gate stack.

17. The method of claim 16, wherein the removed first portion of the work function tuning layer comprises a portion extending to a bottom of a trench between opposing gate spacers.

18. The method of claim 16, wherein the barrier layer further comprises a second portion extending on a second semiconductor fin, and the work function tuning layer further comprises a second portion extending over the second portion of the barrier layer, and wherein when the first portion of the work function tuning layer is removed, the second portion of the work function tuning layer is protected by an etching mask from being removed.

19. The method of claim 16, wherein the first portion of the barrier layer comprises an upper portion, and a lower portion directly underlying and overlapped by the upper portion, and the upper portion is removed by the thinning, and the lower portion remains after the thinning.

20. The method of claim 16, wherein both of the removed first portion of the work function tuning layer and the work function layer comprise Ti, Al, and N.

* * * * *

UNITED STATES PATENT AND TRADEMARK OFFICE
CERTIFICATE OF CORRECTION

PATENT NO. : 11,289,578 B2  
APPLICATION NO. : 16/398922  
DATED : March 29, 2022  
INVENTOR(S) : Hsin-Yi Lee Page 1 of 1

It is certified that error appears in the above-identified patent and that said Letters Patent is hereby corrected as shown below:

In the Claims

Claim 13, Column 16, Line 14; delete "the partially" after "layer".

Claim 15, Column 16, Line 23; delete "TiAIN" and insert --TiAlN--.

Signed and Sealed this
Seventeenth Day of May, 2022

Katherine Kelly Vidal
*Director of the United States Patent and Trademark Office*